(12) United States Patent
Bolognia

(10) Patent No.: US 9,093,360 B2
(45) Date of Patent: Jul. 28, 2015

(54) COMPACT DEVICE PACKAGE

(71) Applicant: Analog Devices, Inc., Norwood, MA (US)

(72) Inventor: David Bolognia, North Andover, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 5 days.

(21) Appl. No.: 13/739,953

(22) Filed: Jan. 11, 2013

(65) Prior Publication Data
US 2014/0197531 A1 Jul. 17, 2014

(51) Int. Cl.
*H01L 23/04* (2006.01)
*H01L 21/00* (2006.01)
*H01L 25/16* (2006.01)
*G06K 9/00* (2006.01)
*H01L 23/538* (2006.01)
*H01L 25/18* (2006.01)
*H04R 25/00* (2006.01)
*G06F 3/01* (2006.01)
*H01L 23/48* (2006.01)

(52) U.S. Cl.
CPC *H01L 25/16* (2013.01); *G06F 3/01* (2013.01); *G06K 9/0002* (2013.01); *H01L 23/48* (2013.01); *H01L 23/5387* (2013.01); *H01L 25/18* (2013.01); *H04R 25/658* (2013.01); *H01L 2223/6677* (2013.01); *H01L 2224/131* (2013.01); *H01L 2224/16225* (2013.01); *H01L 2224/291* (2013.01); *H01L 2224/32225* (2013.01); *H01L 2224/48227* (2013.01); *H01L 2924/1433* (2013.01); *H01L 2924/1461* (2013.01); *H01L 2924/14335* (2013.01); *H01L 2924/15192* (2013.01); *H01L 2924/19106* (2013.01)

USPC .......... 257/685; 257/686; 257/723; 257/730; 257/E23.047; 257/E21.598; 438/109

(58) Field of Classification Search
USPC .......... 257/686, E25.006, E25.021, E25.027, 257/E23.085, 678, 692–697, E23.039, 257/E23.043, E23.06, 685, 723, 724, 730, 257/E23.47, E21.598, E21.599; 438/109, 438/FOR. 368, FOR. 426
See application file for complete search history.

(56) References Cited

U.S. PATENT DOCUMENTS

| | | |
|---|---|---|
| 4,862,153 A | 8/1989 | Nakatani et al. |
| 6,061,245 A | 5/2000 | Ingraham et al. |
| 6,426,240 B2 | 7/2002 | Isaak |
| 6,590,282 B1 | 7/2003 | Wang et al. |
| 6,731,000 B1 | 5/2004 | Haque et al. |
| 6,841,855 B2 * | 1/2005 | Jaeck et al. .................. 257/668 |
| 6,884,653 B2 | 4/2005 | Larson |
| 7,081,373 B2 | 7/2006 | Roeters et al. |
| 7,291,907 B2 | 11/2007 | RaghuRam |
| 2004/0238936 A1 | 12/2004 | Rumer et al. |
| 2005/0012199 A1 | 1/2005 | Rosenau et al. |
| 2006/0033217 A1 | 2/2006 | Taggart et al. |
| 2006/0091508 A1 | 5/2006 | Taggart et al. |
| 2006/0223227 A1 | 10/2006 | Kubota et al. |
| 2011/0255249 A1 | 10/2011 | Lee et al. |
| 2012/0151758 A1 | 6/2012 | Primavera |

\* cited by examiner

*Primary Examiner* — Jasmine Clark
(74) *Attorney, Agent, or Firm* — Knobbe, Martens, Olson & Bear LLP

(57) ABSTRACT

Various embodiments related to a compact device package are disclosed herein. In some arrangements, a flexible substrate can be coupled to a carrier having walls angled relative to one another. The substrate can be shaped to include two bends. First and second integrated device dies can be mounted on opposite sides of the substrate between the two bends in various arrangements.

36 Claims, 17 Drawing Sheets

COMPACT DEVICE PACKAGE

BACKGROUND

1. Field

The field relates to apparatus and methods for packaging, and in particular, to apparatus and methods for forming compact packages.

2. Description of the Related Art

Electronic devices are often manufactured to include numerous components designed to perform multiple functions. For example, advanced sensor devices can include multiple sensors that measure many different types of properties, and multiple processors programmed to process information detected by the sensors. In conventional packages that include multiple components, various device dies may be stacked on a package substrate to reduce the footprint of the package. In other conventional arrangements, through silicon vias (TSVs) may be used to provide a higher level of vertical integration. While these advanced sensor devices are manufactured to incorporate multiple sensors and/or processors, there is a continuing need to integrate the advanced sensor devices within a compact, low profile package.

SUMMARY

In one embodiment, an integrated device package is disclosed. The integrated device package can include a carrier having at least two walls angled relative to one another. A substrate can be coupled to the carrier. In some arrangements, the substrate can have a first bend and a second bend. A first integrated device die can be mounted to a first side of the substrate between the first bend and the second bend. A second integrated device die can be mounted to a second side of the substrate between the first bend and the second bend, the second side opposite the first side.

In another embodiment, an integrated device package is disclosed. The integrated device package can comprise a carrier. The integrated device package can also include a substrate having at least one bend and coupled to the carrier. The substrate can include a first segment that defines at least part of an exterior surface of the integrated device package. A first integrated device die can be mounted to the substrate. A first interfacing feature can be formed on the first segment of the substrate.

In another embodiment, an integrated device package is disclosed. The integrated device package can comprise a carrier having at least two walls angled relative to one another. The at least two walls can define a package housing. A substrate can be coupled to the carrier. The substrate can have at least one bend within the housing, the bend separating first and second segments. A first integrated device die can be mounted to a first side of the first segment of the substrate. A second integrated device die can be mounted to a second side of the first segment of the substrate, the first side opposite the second side.

In yet another embodiment, a method for manufacturing an integrated device package is disclosed. The method can comprise providing a carrier having at least two walls angled relative to one another. A first integrated device die can be mounted to a first side of a substrate. A second integrated device die can be mounted to a second side of the substrate, the second side opposite the first side. The method can include bending the substrate in a first direction to form a first bend, and bending the substrate in a second direction to form a second bend, the second direction opposite the first direction. Further, the method can comprise coupling a segment of the substrate to a first wall of the carrier. The first integrated device die and the second integrated device die can be mounted between the first bend and the second bend.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

These aspects and others will be apparent from the following description of preferred embodiments and the accompanying drawing, which is meant to illustrate and not to limit the invention, wherein.

DETAILED DESCRIPTION

Figure 1A:
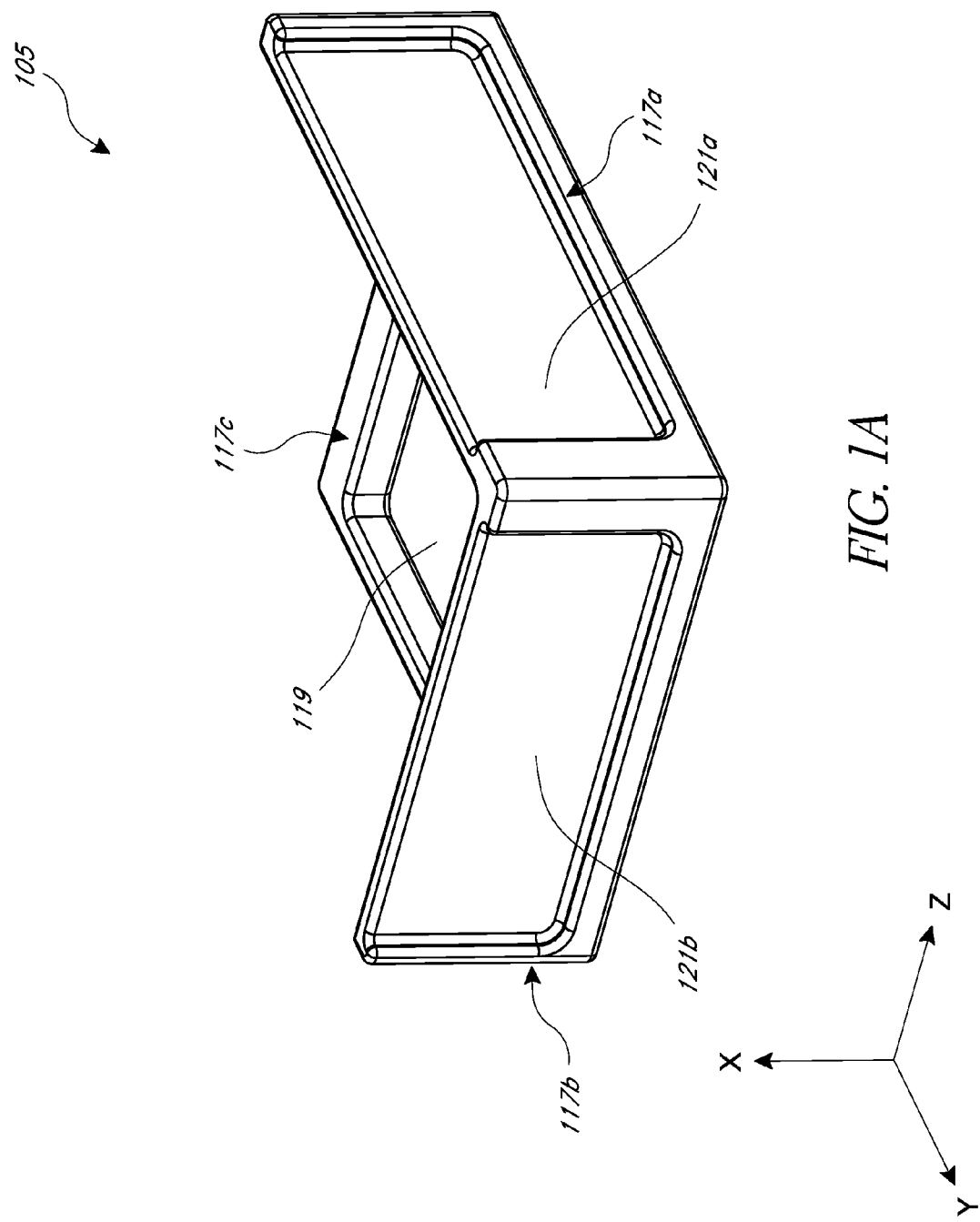
FIGS. 1A, 1C, 1E, and 1G are different three-dimensional perspective views of a three-walled carrier configured to support a flexible substrate, according to one embodiment.

Various embodiments disclosed herein relate to a compact device package that integrates multiple devices. Electronic devices, such as medical devices, mobile computing devices, and consumer electronics, can perform numerous types of functions. For example, as disclosed herein, a hearing aid can incorporate multiple sensors with various functionalities, and multiple processors to process the signals detected by the sensors and/or to control the operation of the package or hearing aid device.

In particular, various compact packages disclosed herein can include a package housing and a substrate coupled to the housing. The substrate can be a flexible substrate that can be bent or folded into various geometrical configurations. The substrate can include many internal conductive traces that provide electrical communication between multiple device dies mounted to the substrate and between the package and an external system substrate (such as a system motherboard). Mounting multiple device dies to a flexible substrate can provide electrical communication between and among all the sensors and/or processors in the package. The package housing can include a carrier having at least two walls angled relative to one another to provide structure for the package. In other arrangements, however, the carrier may be a stiffener with only one wall. To provide for a high level of device integration, the substrate can be bent or folded one or more times, and multiple integrated device dies (e.g., sensor and/or processor dies) can be mounted on both sides of the substrate. In some arrangements, for example, the bends formed in the substrate may be disposed within the housing defined by the at least two walls. By bending or folding the substrate, the package can achieve a high degree of three-dimensional (3D) integration.

In the disclosed embodiments, sensor and/or processor dies can be mounted to the flexible substrate within the housing, e.g., within the housing defined by the at least two walls of the carrier. For example, a microelectromechanical systems (MEMS) sensor and an associated processor (such as an Application-Specific Integrated Circuit, or ASIC) can be mounted to the substrate within the package housing. Additional processor or sensor dies may also be mounted to the substrate within the housing, such as processor die(s) that control the operation of the overall electronic device (for example, a hearing aid) and/or that manage the passive electrical components of the package (such as capacitors). In some embodiments, the substrate can be bent to include two bends. The sensor and/or processor dies can be mounted on a segment of the substrate between the two bends. In some arrangements, the dies can be mounted on opposing sides of the segment between the two bends. In other arrangements, the device dies can be mounted on the same side of the substrate.

The carrier described herein may have any suitable number of walls. For example, the carrier can have at least two walls in various embodiments, such as a two-walled carrier or a three-walled carrier. The carrier can generally be configured to provide structural support for a substrate and device dies mounted to the substrate. In some arrangements, the walls can be angled relative to one another, such as by a 90° angle. Two- and three-walled carriers may advantageously be employed, because the open spaces defined between the angled walls may facilitate assembly of the package. A package assembler can therefore easily couple a package substrate to the carrier, and couple devices to the package substrate, by placing the substrate and device dies within the housing through the open sides of the carrier. For example, in a two-walled carrier, four sides may generally be open to allow the package assembler to couple the substrate and device dies to the carrier. In a three-walled carrier, three sides may generally be open to facilitate package assembly. In other embodiments, however, the carrier may be a substantially planar stiffener, e.g., a plate that does not include at least two angled walls.

In some embodiments, one or more interfacing features can be formed on a segment of the substrate that defines at least part of an exterior surface of the package. The interfacing features can include, e.g., sensors and/or communications devices or components that may be mounted on or integrally formed with the segment of the flexible substrate. For example, a capacitive touch sensor may be disposed on an outer surface of the package and can be configured to detect the movement of a user's finger over the sensor surface. A microstrip antenna may also be integrated on an exterior or outer surface of the package. The antenna can be configured to receive and/or transmit radio frequency (RF) signals from and/or to the package. Such devices can, for example, be integrated into a segment of the package substrate that extends over an outer surface of the carrier. Processor dies associated with the interfacing features may be mounted to the substrate within the package housing.

Advantageously, the embodiments disclosed herein can allow for the integration of multiple different device dies within a small, compact volume, and can also provide interfacing features on the exterior surface of the package. For example, it can be advantageous to dispose interfacing features (e.g., a capacitive sensor, an antenna, an optical sensor, etc.) on the exterior surface of the package to enhance the interaction with the user and/or other devices. Further, it can be advantageous to provide electrical contacts on the exterior of the package to provide electrical communication between the package and an external system substrate (e.g., a system motherboard).

By contrast, for devices or components that may not directly interface with the user or another device, it can be advantageous to mount such devices within the housing to improve the compactness of the package. For example, processor dies and/or sensor dies that may not directly interface with a user or other device (e.g., a motion sensor die) may be mounted within the interior of the housing. To reduce the overall package volume (e.g., including package height and/or a package's lateral footprint), the device dies within the housing may be mounted in close proximity to one another and may be mounted on opposing sides of the substrate that includes bends in order to utilize available space within the housing. An adhesive or molding material can be applied between the dies to provide structural support for the dies.

As an example, to detect sound waves, a hearing aid can include a microphone device die and one or more associated processors to process the detected sound waves and to amplify them for the user of the hearing aid. Although a primary function of conventional hearing aids is to detect and amplify sound, it should be appreciated that the packages disclosed herein may include multiple functionalities that can enhance user experience. For example, in some embodiments, a compact package configured for use in a hearing aid may include additional sensors that can provide the user with a more robust experience. In these embodiments, for example, the microphone device can be provided in a separate package or housing, and these additional sensors can be mounted in or on the disclosed compact package. The disclosed packages can include a motion sensor die (e.g., an accelerometer and/or gyroscopic device die) that can be configured to sense whether a user is falling down and/or whether a user is removing the hearing aid from, or inserting the hearing aid into, her ear. The motion sensor die can be electrically coupled to a motion sensor processor that can activate an alarm or other alert signal that can send for help if the hearing aid determines that a user is falling down. Further, in some embodiments, if the motion sensor and/or its associated processor determines that a user is removing the hearing aid, the package can be configured to send a shut-down signal to the hearing aid to conserve power. The motion sensor die and its associated processor may be mounted within the package housing, at least in part because the motion sensor die may not directly interface or interact with the user or an external device. Mounting the motion sensor die and processor within the housing can therefore free up space on the exterior surface of the package that can be used by various interfacing features.

Furthermore, in some embodiments, the compact package may include a capacitive touch sensor formed on an exterior surface of the package. The touch sensor can be presented on the outside of the package such that the user can interact with the package to turn the device(s) on or off, to adjust the volume, or to send any other instructions to the electronic device. The capacitive touch sensor can electrically communicate with a touch sensor processor mounted within the package housing, which can process signals detected by the touch sensor. Although a capacitive touch sensor is disclosed herein, it should be appreciated that in alternate embodiments a mechanical switch (such as a mechanical on/off button) can be provided on the exterior surface of the package. In some embodiments, the compact package can include an antenna formed on the exterior surface of the package. The antenna can provide wireless data communication between the package and an external device. For example, the antenna can receive and/or send radio frequency (RF) signals from and/or to the package. In one example embodiment, the antenna can receive a wireless signal from a device, such as a television or mobile computing device, and a processor mounted within the housing can convert the received signal into an audio signal that can be amplified and presented to the user by way of speaker(s). In some embodiments, the antenna can transmit wireless RF signals to an external device or user, including information detected by the electronic device, such as, e.g., when the motion sensor determines that the user is falling down. The integrated antenna can also communicate with other components of the hearing aid in some embodiments.

Other sensors and/or processors can be mounted within the housing or on an exterior surface of the housing or package. For example, pressure sensors, temperature sensors, microphone devices, optical sensors, chemical sensors, and other types of sensors may be mounted within the housing and/or on an exterior surface of the package or housing. As an example, in some arrangements, a resistive temperature sensor, or other suitable type of temperature sensor, may be mounted within the package housing to detect the temperature of an object in proximity to the housing in which the temperature sensor is disposed. An optical sensor may be mounted on an exterior surface of the housing and can be configured to detect light in various applications. In some embodiments, a pressure sensor can be mounted within the housing to detect the pressure of an object outside the package, such as air pressure, pressure changes, or the blood pressure of a user wearing the device that incorporates the compact package. It should be appreciated, however, that sensors described herein as being mounted within the housing may alternatively be disposed on an exterior surface of the package housing if suitable for a particular sensor arrangement. Similarly, sensors that are described herein as being positioned on an exterior surface of the housing may instead be mounted within the housing if suitable for the particular application, and/or may include a pathway or aperture providing communication from a die within the housing to an exterior surface of the housing. Skilled artisans will appreciate that a sensor may be mounted within the housing or on an exterior surface of the housing, depending on the suitability of the particular application. The use of the flexible substrate can advantageously provide electrical communication between the sensors and various processors mounted to the substrate.

It should be appreciated that while the disclosed embodiments describe compact sensor modules that include sensors and processors, the disclosed embodiments can be implemented in any other suitable type of device package, including packages that do not include sensors. Furthermore, while various examples disclosed herein relate to packages suitable for integration in a hearing aid device, the disclosed packages may also be implemented in any other suitable device, such as other medical devices, mobile computing devices, consumer electronics devices, etc. For example, the packages disclosed herein may be implemented in a variety of wearable electronics devices, such as wearable medical devices that can monitor one or more biological functions. As one example, the highly integrated, compact packages disclosed herein may also be implemented in a wearable blood pressure or heart monitor (e.g., electrocardiographic or EKG monitor, or a heart pulse monitor), a blood glucose monitor, or a blood oxygen monitor (oximeter). For example, for the wearable blood pressure or heart monitor, a pressure sensor die can be mounted to the substrate within the housing or on an exterior surface of the package. For the glucose monitor or the blood oxygen monitor, an optical sensor can be mounted to the substrate on an exterior surface of the package. Such medical monitoring sensors may be implemented in a wearable device, such as a wristwatch or a bandage-type structure. Processors can be mounted within the housing to process the signals detected by the blood pressure monitor, heart monitor, blood glucose monitor, or blood oxygen level monitor.

FIGS. 1A, 1C, 1E, and 1G are different 3D perspective views of a carrier 105 configured to support a flexible substrate, according to one embodiment. Throughout this disclosure, reference will be made to components relative to the illustrated 3D reference system. For example, various components may be described as lying in or presented on the X-Z plane, the X-Y plane, the Y-Z plane, etc. It should be appreciated that the illustrated coordinate system is for purposes of illustration only and should not be interpreted as an absolute position of any of the disclosed components nor a limitation to solely orthogonally oriented walls.

The carrier 105 can serve as a stiffener that provides structural support for the package. For example, the carrier 105 can serve to protect the package against external forces, such as when the package is dropped or otherwise impacted. Furthermore, the carrier 105 can be shaped and sized to define the approximate volume of the assembled package. For example, the walls of the carrier 105 can be dimensioned and selected to fit within a predetermined space in the electronic device. As explained above, the carrier 105 can assist in the assembly of the package by, e.g., a robotic manipulator programmed to pick and place components in the package. Because there are fewer than four walls in the disclosed embodiments (e.g., the three-walled carrier of FIGS. 1A-1H), the open sides of the carrier 105 enable a package assembler to easily access the interior of the package housing defined by the walls of the carrier 105. For example, in the three-walled carrier 105 of FIGS. 1A, 1C, 1E, and 1G, the assembler can access the package interior by way of the three open sides of the carrier, e.g., the three sides of the carrier 105 that do not include a wall. By having relatively few walls, the assembled package can occupy less volume and can facilitate package assembly.

The carrier 105 disclosed herein can have at least two walls angled relative to one another. For example, as shown in FIGS. 1A, 1C, 1E, and 1G, the carrier 105 has three walls—a first wall 117a, a second wall 117b, and a third wall 117c—angled relative to one another. In particular, the three walls 117a, 117b, and 117c are angled relative to one another to form a corner region, e.g., the three walls 117a, 117b, and 117c are formed at a 90° angle relative to one another. The volume within the three angled walls 117a-117c can be configured to define a package housing. Further, the first wall 117a and the second wall 117b can include a first recess 121a and a second recess 121b, respectively. The first and second recesses 121a and 121b can be sized and shaped to receive segments of the substrate. For example, as explained in more detail herein, the segments can extend from the substrate and can be mounted in or coupled to the recesses 121a and 121b. The third wall 117c can include an aperture 119 formed therethrough. The aperture 119 can be sized and shaped so that a segment of the substrate can be positioned in or near the aperture 119. One or more device dies that communicate outside of the package (for example, sensor dies) can be mounted to the substrate and can be positioned within the aperture 119. Further the aperture 119 can provide access to an external substrate, such as a system substrate or motherboard coupled to the package. For example, a segment of the substrate can electrically couple to the motherboard of the larger system through the aperture 119.

The carrier 105 can be made of any suitable material that provides structural support for the compact package. For example, in some embodiments, the carrier 105 can be formed from a plastic material. In other embodiments, the carrier 105 can be formed from a metal, such as aluminum. In general, therefore, the carrier 105 can define a package housing defined by the walls 117a, 117b, and 117c that are angled relative to one another. As explained below, the substrate can be coupled to the carrier 105 and can support one or more device dies. Some device dies can be mounted within the package housing, e.g., within the corner portion defined by the three walls 117a, 117b, and 117c. Other components, like the interfacing features, can be formed on portions of the substrate that define an exterior surface of the package.

FIGS. 1B, 1D, 1F, and 1H are 3D perspective views of an assembled compact device package 100 illustrating the flexible substrate 103 coupled to the carrier 105, shown in the same 3D perspective views as FIGS. 1A, 1C, 1E, and 1G, respectively. FIG. 1I is a side view of the assembled compact device package 100 of FIGS. 1B, 1D, 1F, and 1H, as viewed in the X-Y plane. FIG. 1J is a side view of the assembled compact device package 100 of FIGS. 1B, 1D, 1F, and 1H, as viewed in the Z-X plane. The carrier 105 has been omitted from FIGS. 1I and 1J for ease of illustration. The package 100 can include the substrate 103 coupled to the carrier 105, which defines the package housing. As can be seen from FIGS. 1F, 1H, 1I, and 1J, within the package housing defined by the carrier 105, the illustrated package 100 can include a crystal or other oscillator 124 to provide a reference frequency for clock(s), a motion sensor die 126, such as a MEMS gyroscope or accelerometer, one or more passive components 128, an integrated passive device (IPD) die 130, an Application-Specific Integrated Circuit (ASIC) die 132, a controller die 134, and a signal processing die 136.

Furthermore, one or more interfacing features can be provided on the substrate on an exterior surface of the package 100. For example, the package 100 can include interfacing features, such as a capacitive touch sensor 107 and a microstrip antenna 109 (see, e.g., FIGS. 1B and 1D). The package 100 can also include a capacitive sensor processor die 120 and a wireless communications die 122 configured to process data detected, received, or transmitted by the capacitive touch sensor 107 and the antenna 109, respectively (see, e.g., FIGS. 1B, 1F, 1I, and 1J). While illustrated on an external surface of the package 100, the skilled artisan will appreciate that the processors 120, 122 for the external interfacing features 107, 109 can also be located in more protective locations within the package 100. The processors 120, 122 can also be encapsulated. Electrical contact pads 111 can also be formed on an exterior surface of the package (see, e.g., FIGS. 1D and 1H). In the illustrated embodiment, the contact pads 111 are formed in the substrate 103 and exposed through the aperture 119 of the carrier 105.

The substrate 103 can be coupled to one or more of the walls 117a-117c of the carrier 105. For example, in some embodiments, segments of the substrate 103 can be attached to the carrier using an adhesive, such as an epoxy. As best seen from the unfolded views of FIGS. 2A-2B, the substrate 103 can include multiple segments 115a, 115b, 115c, 115d, 115e, and 115f that can be defined at least in part by multiple bends 113a, 113b, 113c, 113d, and 113e, that separate the segments from one another. Further, the substrate 103 can have a first side 116 (see, e.g., FIGS. 2A, 1B, 1H, and 1I) and a second side 118 (see, e.g., FIGS. 2B, 1H and 1I) opposite the first side 116. Integrated device dies (e.g., sensors or processors) may be mounted on and electrically coupled to both the first and second sides 116, 118 of the substrate 103, using any suitable electrically conductive adhesive. For example, in some arrangements, solder, anisotropic conductive film (ACF) or non-conductive paste (NCP) technologies can be used to electrically couple device dies to the substrate 103.

As explained herein, the substrate 103 can be a flexible substrate with integrated bond pads, leads and traces that are configured to provide electrical communication between components coupled to the substrate 103. Flexible substrates can be useful in arrangements where it is desirable for the substrate to conform to a particular geometry employed within a system. Flexible substrates can be made of a flexible plastic material, such as polyimide or PEEK and can include integrated bond pads, traces and leads similar to those used in conventional PCB substrate technologies. The flexible substrate can be bent or folded to conform to a particular geometry, which permits contacting downstream components in a variety of configurations. Furthermore, traces and leads can be patterned on or within the flexible substrate in very small dimensions. For example, in some embodiments, the traces can have line widths and spaces on the order of about 15 to 20 μm, and the leads or bond pads can have widths or diameters of about 200-300 μm with similar spacing, such that the pitch is on the order of 400-600 μm. The skilled artisan will appreciate, however, that folds or bends in the substrate can be accomplished with different materials.

Figure 1B:
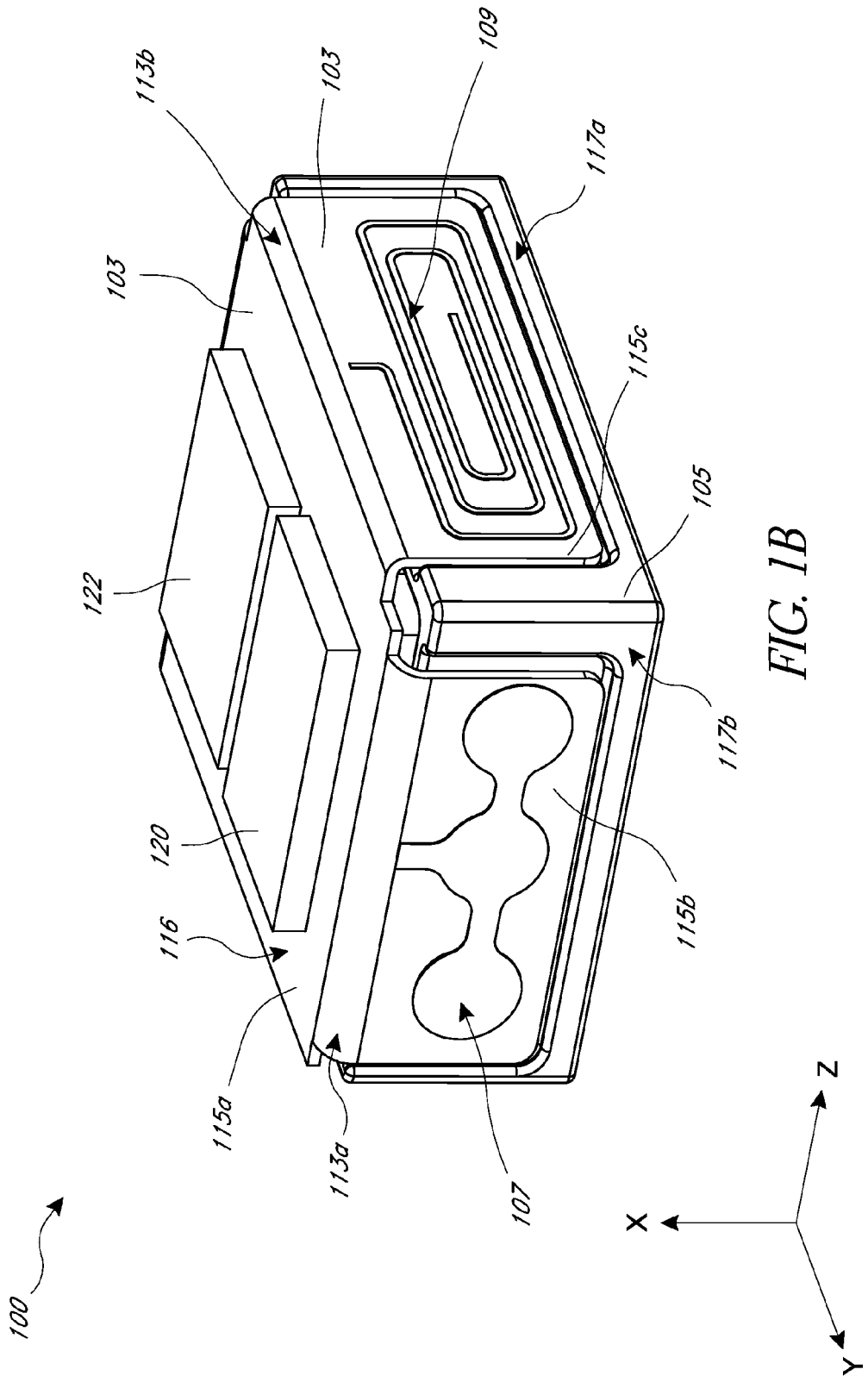
FIGS. 1B, 1D, 1F, and 1H are three-dimensional perspective views of an assembled compact device package illustrating the flexible substrate coupled to the carrier, shown in the same 3D perspective views as FIGS. 1A, 1C, 1E, and 1G, respectively.
Figure 1C:
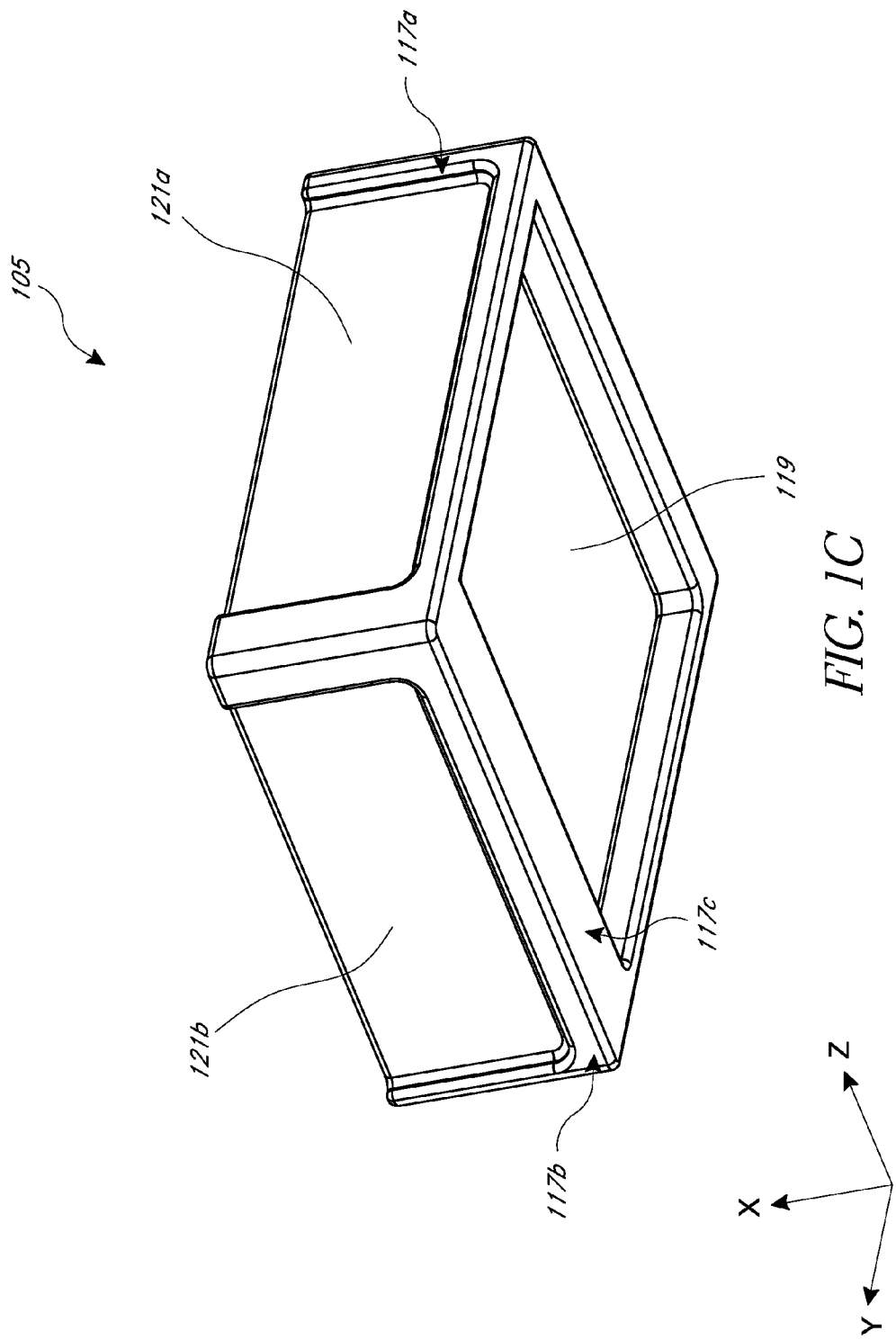
Figure 1D:
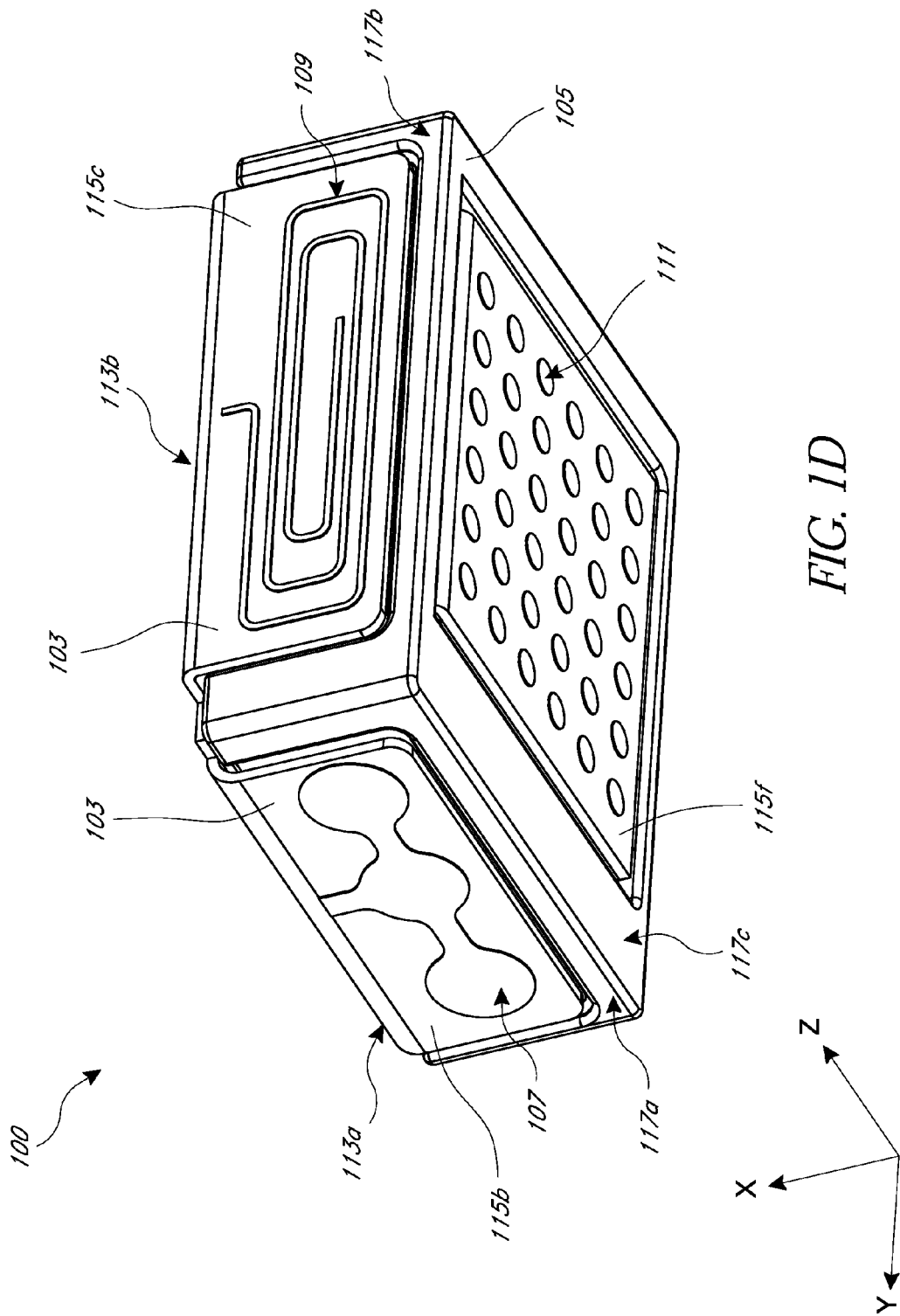
Figure 1E:
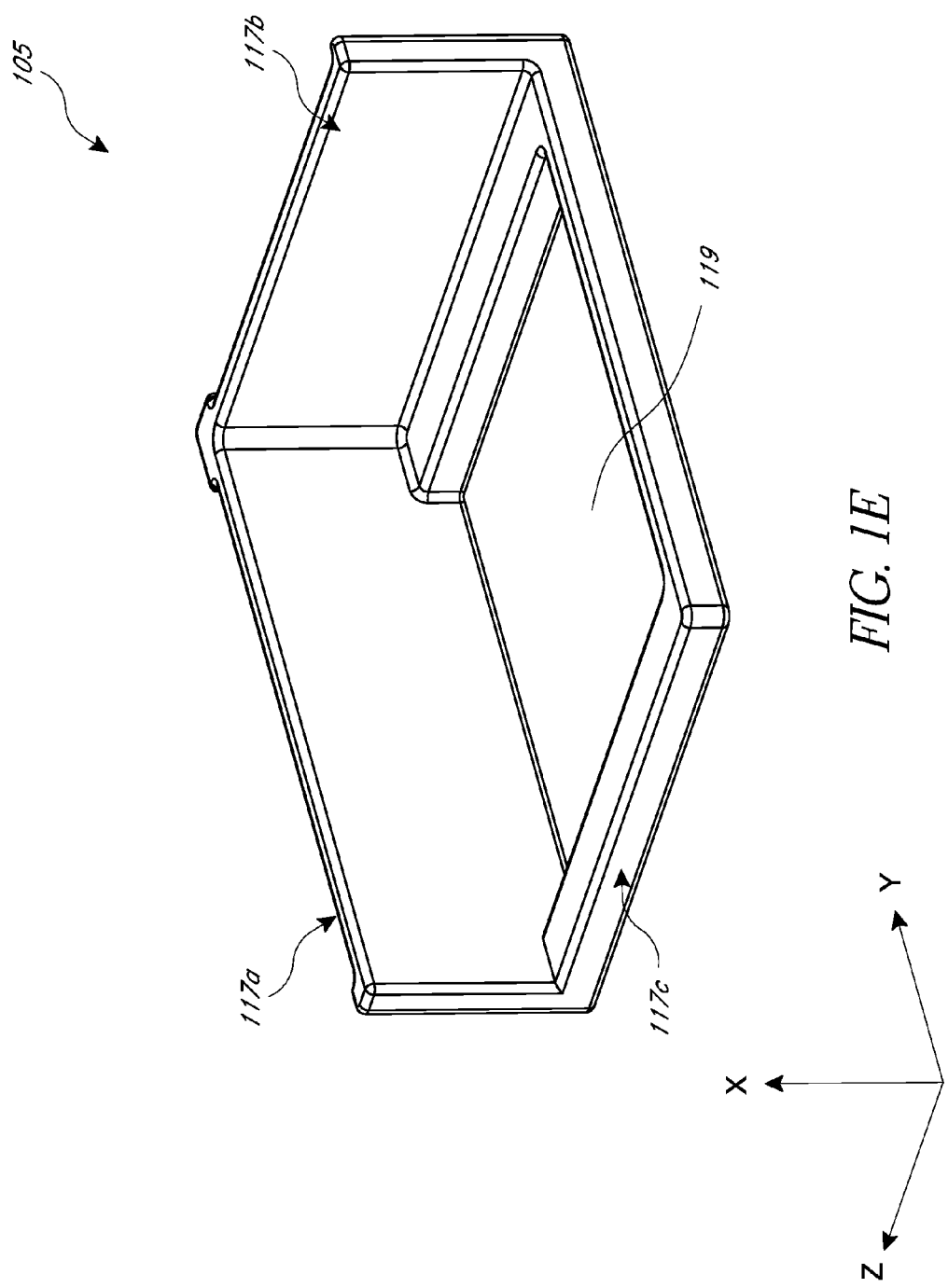

As shown in FIGS. 1B and 1D, segment 115a can be disposed over an open side of the carrier 105. Indeed, in the illustrated embodiment, the bends 113a and 113b formed in the substrate 103 can be formed at an angle of between about 80° and about 100° (e.g., at about a 90° angle) such that segment 115a is disposed over an open side of the carrier 105 (e.g., between walls 117a and 117b), and such that segments 115b and 115c extend from segment 115a to couple to external surfaces of walls 117b and 117a of the carrier 105, respectively. For example, bend 113a can be bent about the z-axis, and bend 113b can be bent about the y-axis. As explained above, the segments 115b and 115c can be received by the recesses 121b and 121a in the walls 117b and 117a, respectively. As shown in FIGS. 1D and 1H, segment 115f can be positioned to be exposed through the aperture 119 formed through wall 117c of the carrier 105. For example, the bend 113e (bent around the y-axis, see FIG. 1J) can be formed at an angle between about 170° and about 190° (e.g., about 180°) between segments 115e and 115f.

It should be appreciated that segments 115a, 115b, 115c, and 115f each define at least part of an exterior surface of the package 100, because segments 115a, 115b, 115c, and 115f are disposed on an outer surface of the carrier 105 and/or exposed outside the housing defined by the walls 117a-c of the carrier 105. Interfacing features and electrical contacts can be provided on segments that define the exterior surface of the package. For example, one type of interfacing feature, the capacitive touch sensor 107, can be formed in segment 115b, and another type of interfacing feature, the microstrip antenna 109, can be formed in segment 115c. For example, segment 115b of the substrate 103 can be suitably patterned with conductive and insulating materials that are configured to detect a changing capacitance induced by coming into contact with a user's finger, for example. In other arrangements, a capacitive touch sensor 107 can be formed in a device that is mounted to segment 115b. As explained above, when implemented in various electronic devices (such as a hearing aid), the touch sensor 107 may be used to turn the device on or off, to adjust the volume of the device, and/or to transmit other suitable instructions to the device. In some embodiments, the microstrip antenna 109 can be patterned onto segment 115c of the substrate 103 in a serpentine pattern, or any other suitable pattern. For example, the antenna 109 can be formed of a conductive material and can be disposed on a portion of the exterior surface of the package 100 in order to provide improved wireless communication with an external device. In some embodiments, a separate antenna can be mounted on segment 115c of the substrate 103. The antenna 109 can be shaped and sized to receive and/or transmit wireless data communication at any suitable band of frequencies, e.g., RF frequencies. In some embodiments, for example, the antenna 109 can be shaped and sized to provide communication over a Bluetooth and/or wireless Internet connection.

Furthermore, electrical contact pads 111 can be formed in segment 115f, which also forms part of an exterior surface of the package 100. The illustrated array of contact pads 111 can be formed of a conductor, such as copper or gold, and can be shaped and positioned to electrically couple to corresponding landing pads or leads on an external device or system motherboard. For example, as shown in FIGS. 1D and 1H, segment 115f can be positioned in or near the aperture 119 of the carrier 105, and the contact pads 111 can be arranged to couple to corresponding landing pads on a motherboard that is incorporated in a larger electronic device. As explained above, the substrate 103 can include multiple traces (not shown) integrated therein that provide communication between the devices mounted on the substrate 103. The signals transmitted from the various device dies (e.g., sensors, ASICs) can be communicated to the electrical contact pads 111 by way of these internal traces, and the electrical contact pads 111 can transmit these signals to the larger system. Thus, the contact pads 111 can provide electrical communication between the components within or on the package 100 and the remainder of the electronic device.

Figure 1F:
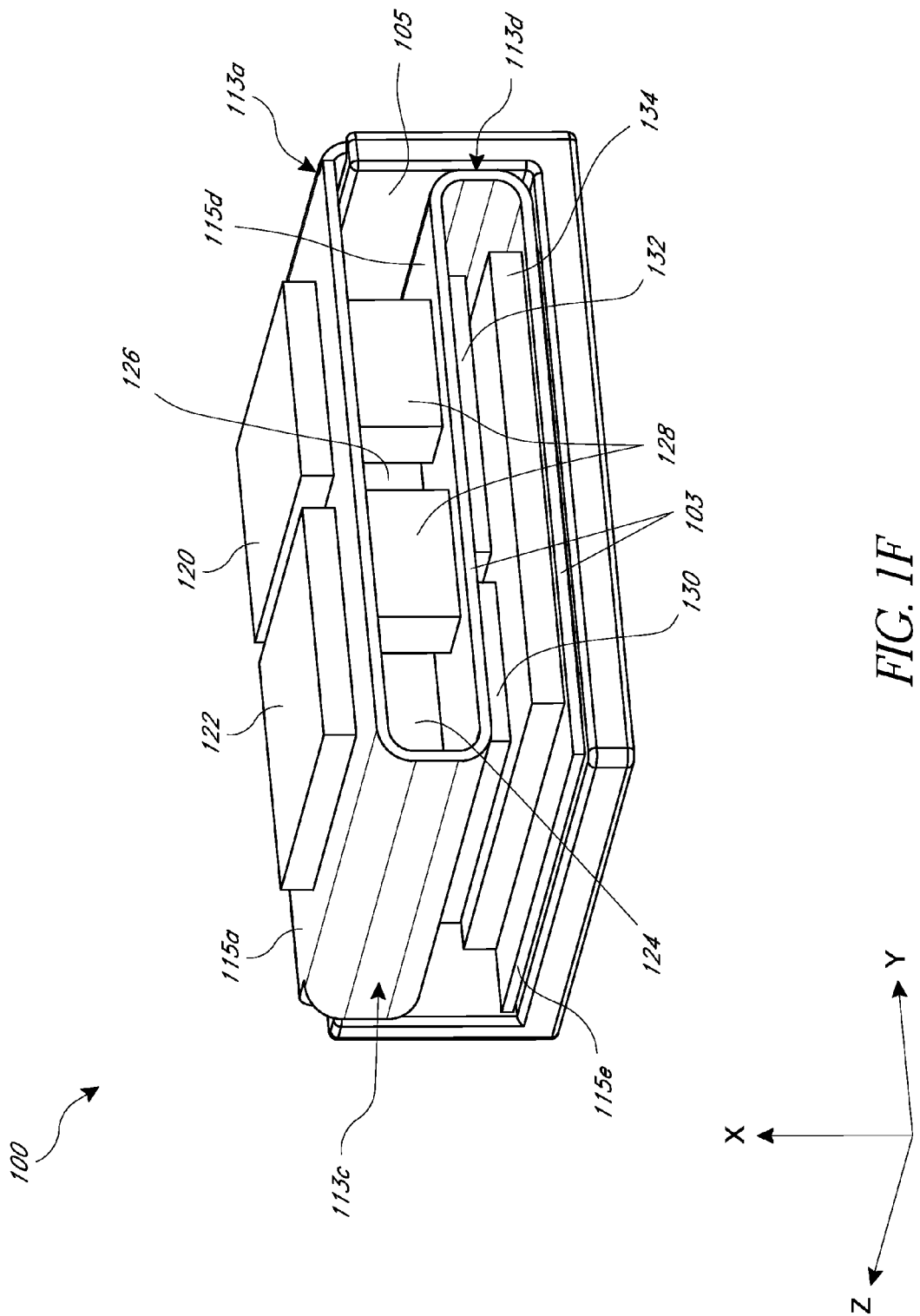
Figure 1G:
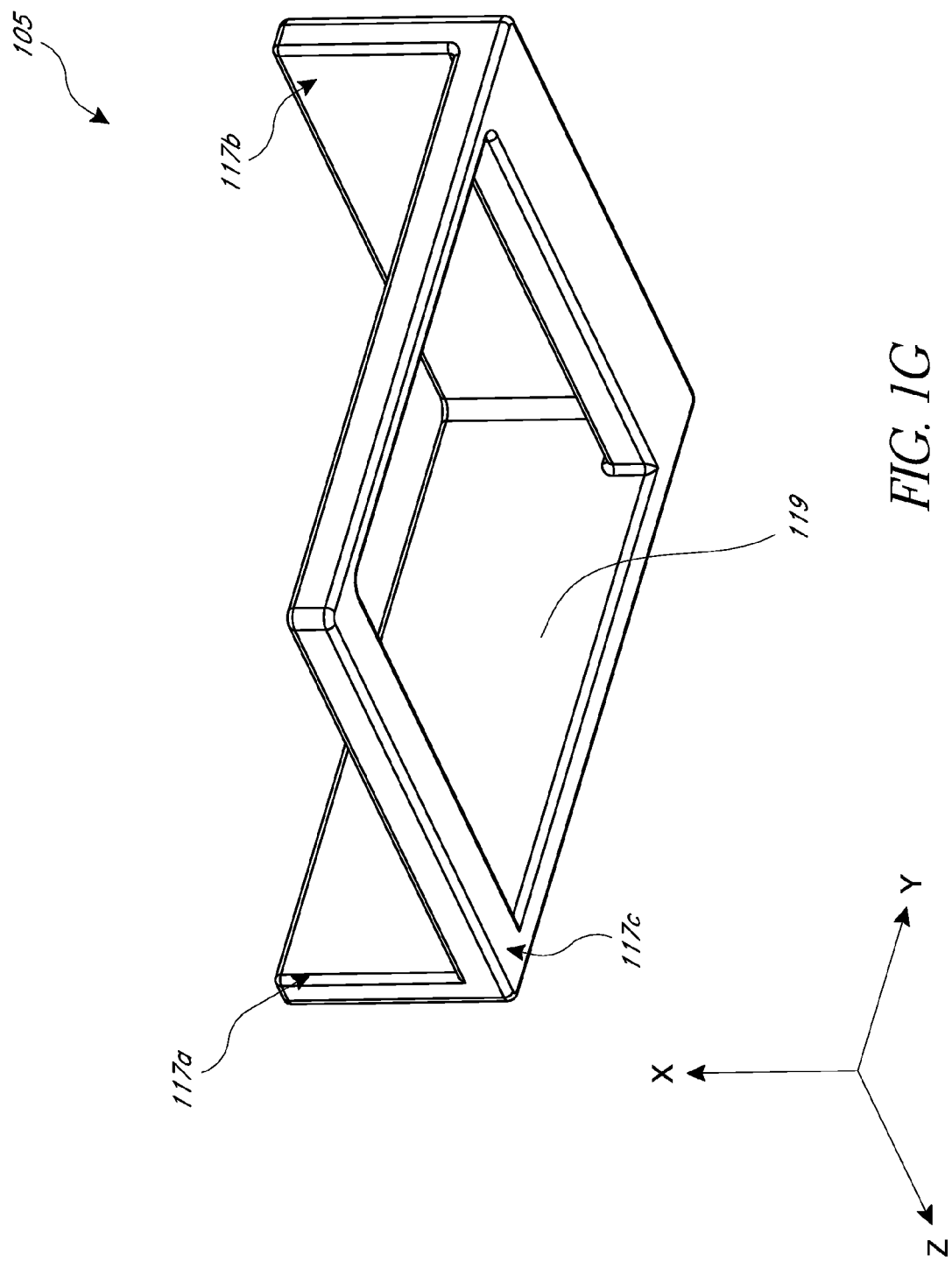
Figure 1H:
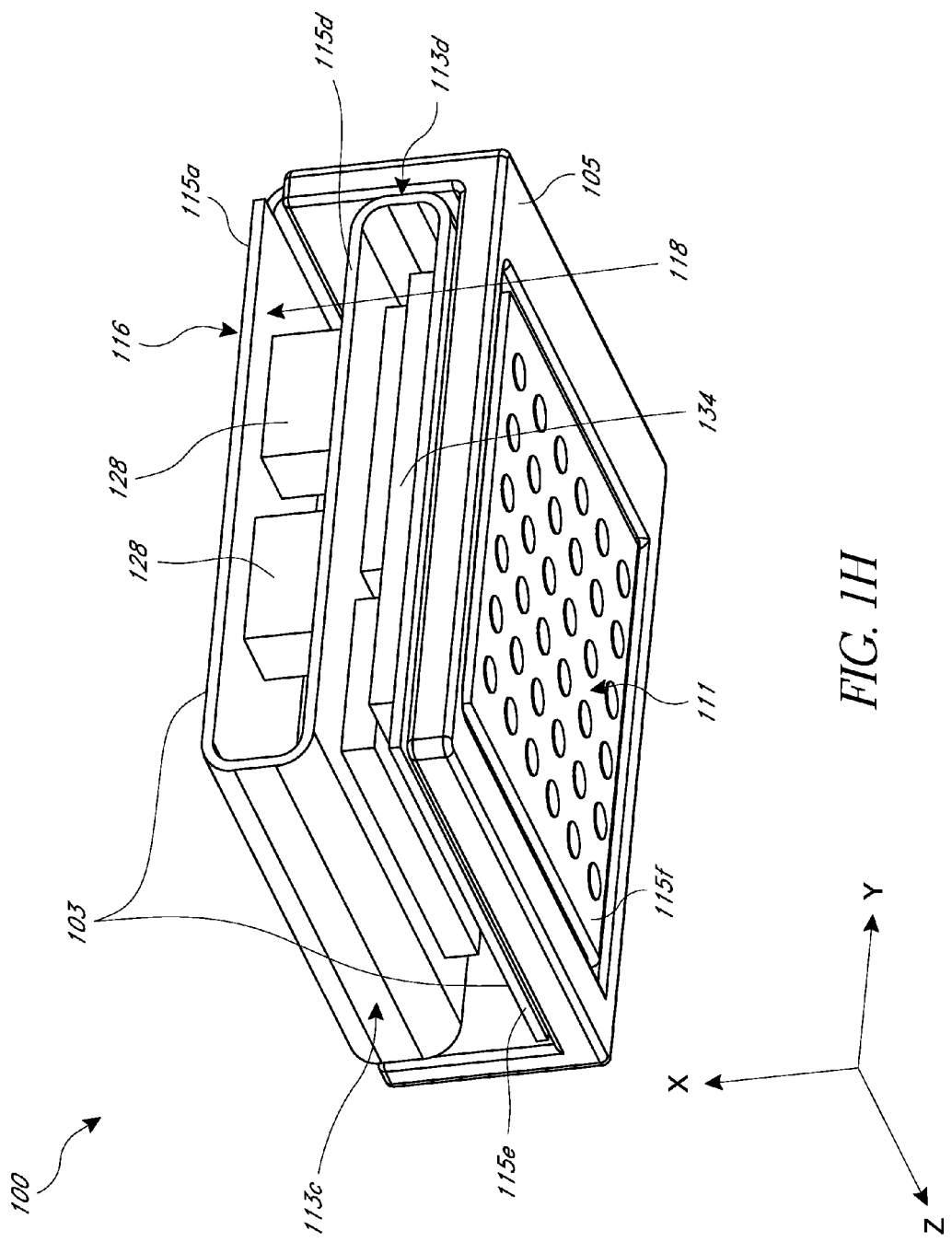
Figure 1I:
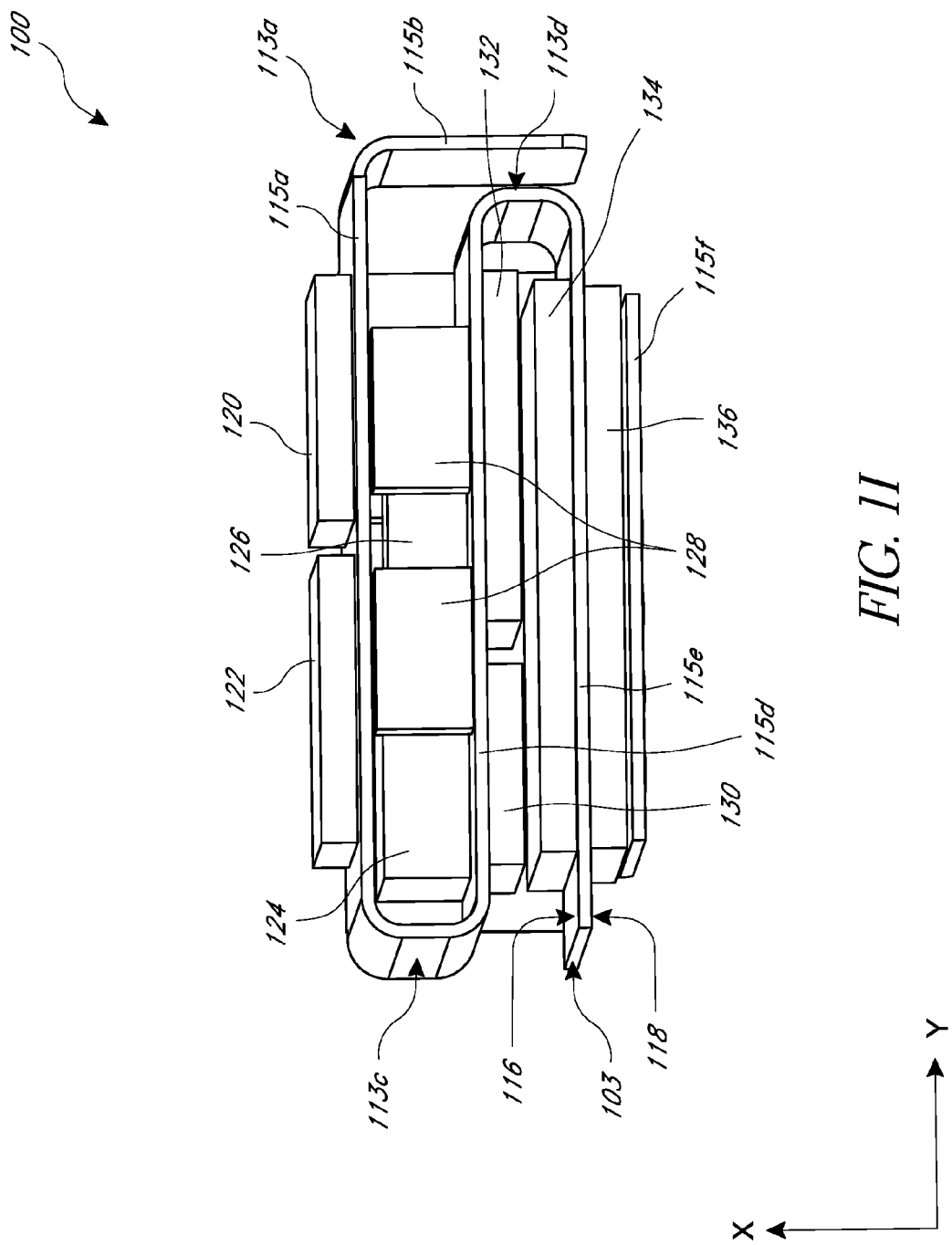
FIG. 1I is a side view of the assembled compact device package of FIGS. 1B, 1D, 1F, and 1H, as viewed in the X-Y plane, without the carrier.
Figure 1J:
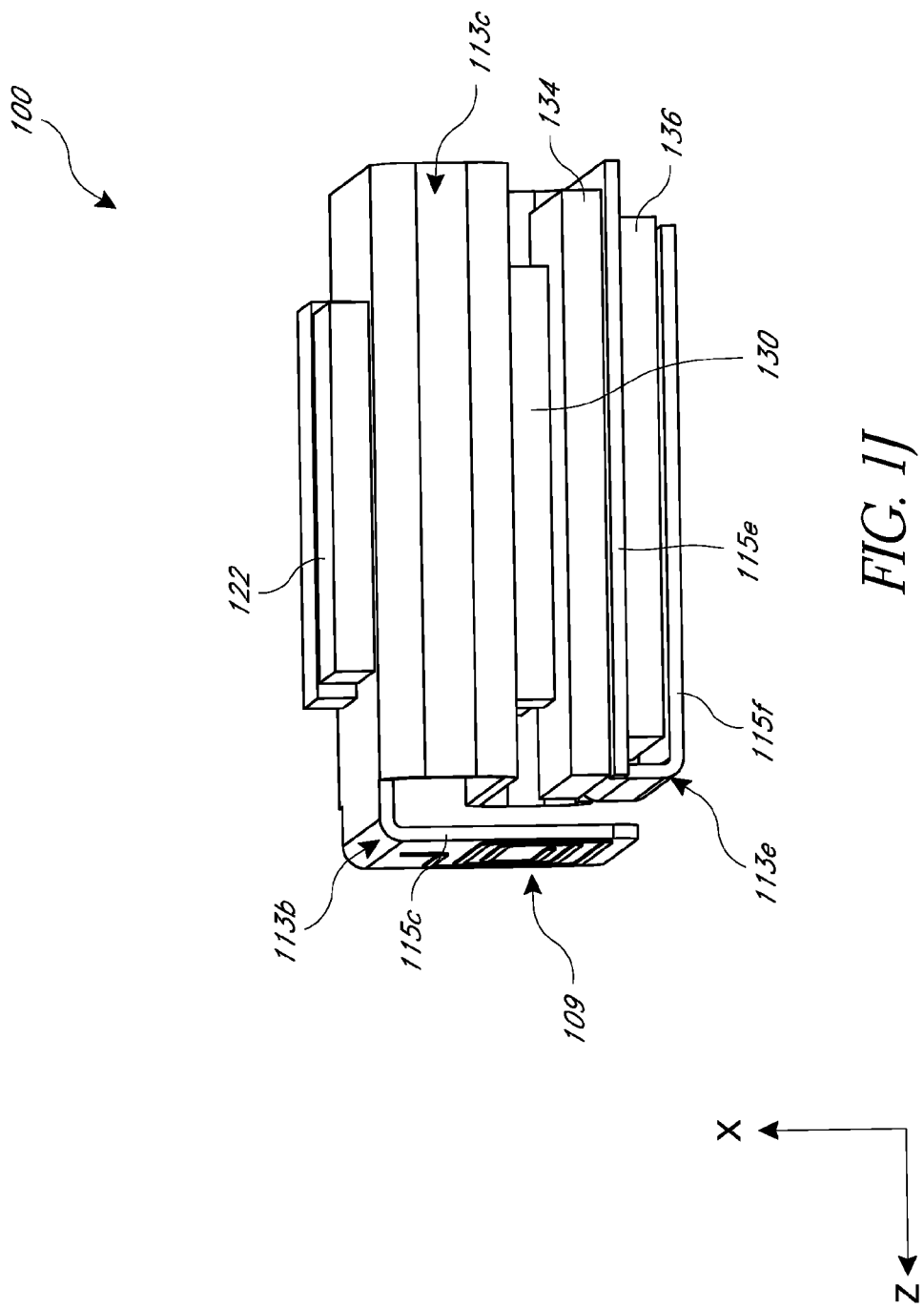
FIG. 1J is a side view of the assembled compact device package of FIGS. 1B, 1D, 1F, and 1H, as viewed in the Z-X plane, without the carrier.

In FIGS. 1B, 1F, and 1I, the capacitive sensor processor die 120 and the wireless communications die 122 are shown as being mounted on the first side 116 of the segment 115a, e.g., on the exterior surface of the package 100. The internal traces of the substrate 103 can provide electrical communication between the capacitive touch sensor 107 and the capacitive sensor processor die 120, and between the microstrip antenna 109 and the wireless communications die 122. The capacitive sensor processor die 120 can receive and process signals detected by the capacitive touch sensor 107. For example, a user may turn the electronic device on or off, may adjust the volume, or may send other instructions to the electronic device by moving her finger on the capacitive touch sensor 107. The wireless communications die 122 can receive and process signals received by the antenna 109, and/or the wireless communications die 122 can process and transmit signals to the antenna 109 that are to be transmitted by the antenna 109 to an external device. For example, the antenna 109 can receive a wireless data signal from an external device, such as a mobile computing device, and the wireless communications die 122 can process the data signal such as for output to the user as sound waves. Although the capacitive sensor processor die 120 and the wireless communications die 122 are shown on segment 115a, it should be appreciated that these two processor dies may also be mounted within the package housing, e.g., within the protected volume formed by the three walls 117a-117c of the carrier 105.

Turning to FIGS. 1F and 1H-1J, various components are illustrated that are mounted to the substrate 103 within the housing, e.g., mounted within the protected volume formed by the three walls 117a-117c of the carrier 105. For example, bends 113c and 113d can be formed at an angle between about 170° and about 190°, e.g., at about 180°. As shown in FIG. 1F, the bends 113c and 113d can be disposed within the housing, e.g., within the volume defined by the three walls 117a-117c. For example, bend 113c can be formed between segments 115a and 115d, and bend 113d can be formed between segments 115d and 115e. The bends 113c and 113d can be bent in opposite directions about the z-axis, as shown in, e.g., FIGS. 1F and H. As shown in FIG. 1J, bend 113e can be formed about the y-axis, and segment 115f can extend from segment 115e and bend 113e. Multiple integrated device dies (e.g., sensors and processors) can be mounted on both sides 116 and 118 of the substrate 103, and can be mounted on any of segments 115a, 115d, 115e, and/or 115f. It should be appreciated that, while various device dies are shown as being mounted to a particular segment and/or side of the substrate 103, individual device dies can instead be mounted on other segments and/or the other side of the substrate 103. Because traces within or on the substrate 103 provide electrical communication between the device dies mounted to the substrate 103, the illustrated positions of the device dies should not be interpreted as limiting their positions in the package 100.

For example, the oscillator 124, the motion sensor die 126, the passive components 128, the IPD die 130, and the ASIC die 132 can be mounted to the substrate 103 between bends 113c and 113d. As shown in, e.g., FIGS. 1F and 1I, the oscillator 124, the motion sensor die 126, and the passive components 128 can be mounted to the second side 118 of the substrate 103. The IPD die 130 and the ASIC die 132 can be mounted to the first side 116 of the substrate 103. In some embodiments, the motion sensor die 126 can be a gyroscopic die or an accelerometer die. For example, the motion sensor die 126 can be manufactured as a MEMS motion sensor die. In some implementations, the motion sensor die 126 can be configured to determine whether the user is falling down. Furthermore, the motion sensor die 126 can be used to detect whether the user moves the electronic device and can communicate with other components to automatically turn the electronic device on or off. For example, if the user removes a hearing aid that includes the package 100 from her ear, the motion sensor die 126 and the ASIC die 132 can determine that the user intends to shut down the hearing aid and can send a shutdown signal to the hearing aid. The motion sensor die 126 can be in electrical communication with the ASIC die 132 by way of the traces within or on the substrate 103. The ASIC die 132 can process the signals detected by the motion sensor die 126 and can integrate or otherwise manipulate the signals to determine orientation and/or acceleration.

The passive components 128 can include one or more passive electrical components, such as, e.g., capacitors, resistors, etc. The passive components 128 can be configured to smooth electrical signals that are transmitted from the sensor dies to the processor dies, or any other suitable signals. The IPD die 130 can provide for central management of the various passive electrical components.

Furthermore, as shown in FIGS. 1F and 1H-1J, the controller die 134 and the signal processing die 136 can be mounted to segment 115e, which is defined adjacent bends 113d and 113e. In the illustrated embodiment, the controller die 134 is mounted to the first side 116 of the substrate 103, and the signal processing die 136 is mounted on the second side 118 of the substrate 103. Of course, the controller die 134 and the signal processing die 136 can be mounted on the second side 118 and the first side 116, respectively. Further the controller die 134 or the signal processing die 136 can also be mounted on segment 115f, e.g., on the second side 118 of segment 115f.

In some embodiments, the controller die 134 can be configured to act as a controller for the entire package 100 and/or the larger electronic device into which the package 100 is incorporated. For example, the controller die 134 can be programmed to manage the communications between the device dies mounted in the package 100, and can also be programmed to manage the power consumption of the device dies in the package 100. In general, therefore, the controller die 134 can act to control the overall operations of the package 100 and/or the larger device (e.g., hearing aid). The signal processing die 136 can be a digital signal processing die in some embodiments. For example, the signal processing die 136 can be programmed to process audio signals detected by the microphone device(s) located in other parts of a hearing aid. For example, analog audio signals can be transmitted from the microphone device(s) to the signal processing die 136 by way of the electrical contacts 111. The signal processing die 136 can convert the analog signals to digital signals and can provide for the amplification of the audio signals before being transmitted to the user by the speaker(s) provided in the hearing aid.

As shown in FIGS. 1A-1J, numerous integrated device dies can be mounted on both sides of the substrate 103. To provide a structurally connected package 100, an adhesive or molding material can be provided between the segments that are bent relative to one another. For example, although not illustrated in FIGS. 1I-1J, an epoxy or molding material can be applied between segments 115a and 115d, between segments 115d and 115e, and between segments 115e and 115f to encapsulate the device dies that are formed on those segments of the substrate 103 and to structurally unify the package 100. The adhesive or molding material can thereby act to provide structural support such that the substrate 103 does not become unfolded during operation or manufacturing.

While the embodiment of FIGS. 1A-1J has been described as including particular types of sensors and/or processors, it should be appreciated that the disclosed components illustrate only a few examples of the sensors and/or processors that may be used in various embodiments. Any other suitable combination of sensors and/or processor dies may be used with the disclosed embodiments. Furthermore, the embodiment of FIGS. 1A-1J depicts various dies at particular locations of the substrate 103. However, it should be appreciated that each die shown in FIG. 1A-1J may be mounted at any other suitable position in or on the package 100. One advantage of the disclosed embodiments is that the substrate 103 can provide electrical communication among the dies or devices, regardless of where the dies are physically mounted in the package 100.

Figure 2A:
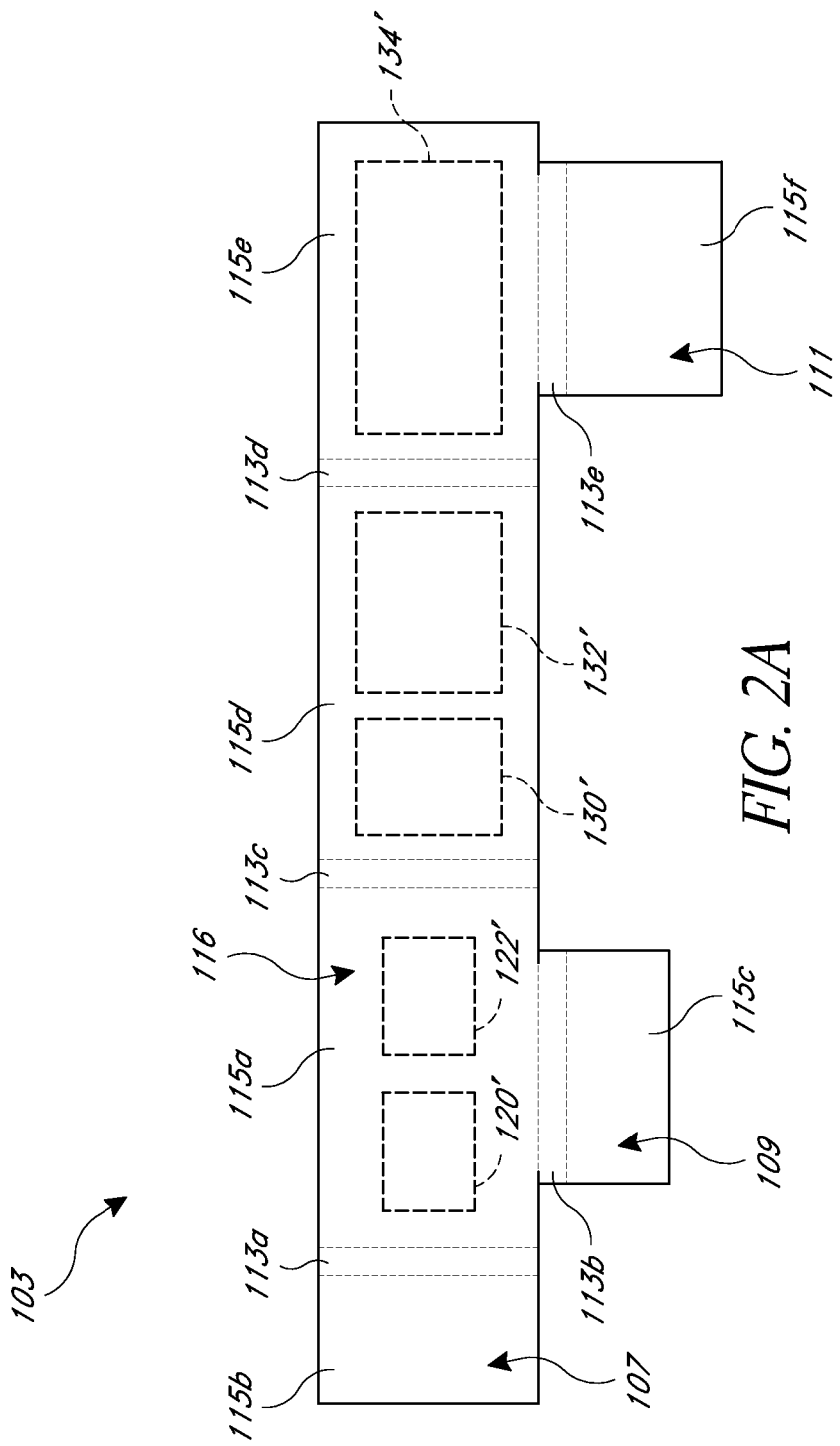
FIG. 2A is a plan view of a first side of the flexible substrate of FIGS. 1B, 1D, 1F, and 1H-J, shown in an unfolded configuration.
Figure 2B:
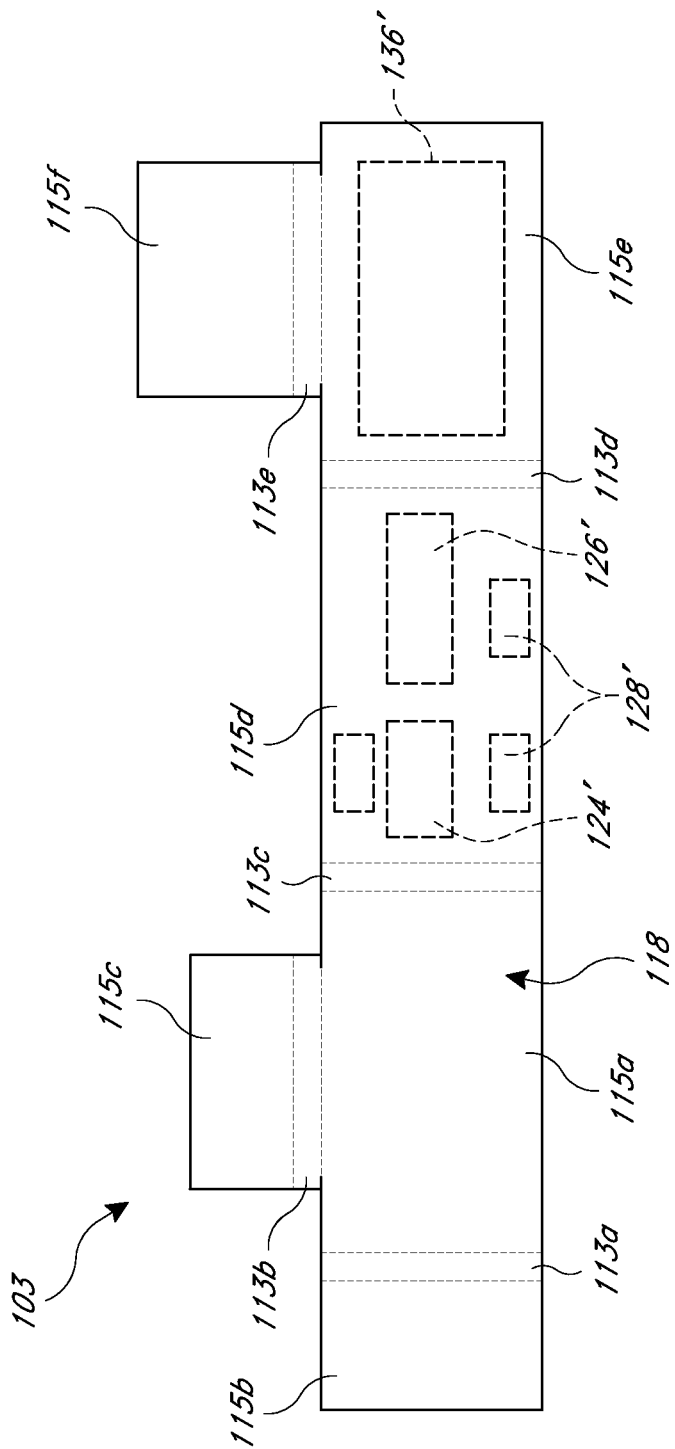
FIG. 2B is a plan view of a second side of the flexible substrate of FIG. 2A, shown in an unfolded configuration.

FIG. 2A is a plan view of the first side 116 of the flexible substrate 103 of FIGS. 1B, 1D, 1F, and 1H-J, shown in an unfolded configuration. FIG. 2B is a plan view of the second side 118 of the flexible substrate 103 of FIG. 2A, shown in an unfolded configuration. The bends 113a-113e are shown outlined by dashed lines. Furthermore, the portions of the substrate 103 to which the device dies are mounted are illustrated in dashed lines and denoted by reference numerals annotated with a prime (') symbol. For example, as shown in FIGS. 2A-2B, integrated device dies can be mounted and electrically connected (e.g., in flip-chip fashion) to segments 115a, 115d, and 115e. Segments with mounting regions can either include adjacent bond pads for wire bonding, or, as is preferred, bonding pads within the mounting regions for flip-chip mounting.

Segments 115b and 115c can extend from segment 115a, and segment 115f can extend from segment 115e. The first side 116 of segments 115a, 115b, 115c, and 115f can be bent to form at least part of an exterior surface of the package. Indeed, the interfacing features can be integrated with one or more of segments 115a, 115b, 115c, and 115f. For example, the capacitive touch sensor 107, one example of an interfacing feature, can be formed within segment 115b and can be sensitive to touch on the first side 116. The microstrip antenna 109, another example of an interfacing feature, can be formed within segment 115c and can communicate wirelessly from the outwardly facing first side 116. The electrical contact pads 111 can be exposed on the first side 116 of segment 115f.

In addition, as shown in FIG. 2A, the capacitive sensor processor die 120 and the wireless communications die 122 can be mounted in mounting regions 120' and 122', respectively, on the first side 116 of segment 115a of the substrate 103. The IPD die 130 and the ASIC die 132 can be mounted in mounting regions 130' and 132', respectively, on the first side 116 of segment 115d of the substrate 103. Further, the controller die 134 can be mounted in mounting region 134' on the first side 116 of segment 115e. In other embodiments, one or more interactive sensor dies (e.g., optical, pressure, sound or chemical sensors) are mounted on the first side 116 of segment 115a, which is exposed in the package 100 (see, e.g., FIG. 1B).

As shown in FIG. 2B, the oscillator 124, the motion sensor die 126, and the passive electrical components 128 can be mounted on the mounting regions 124', 126', and 128', respectively, of the second side 118 of segment 115d. Thus, in the illustrated embodiment, the mounting regions 124', 126', and 128' for the oscillator 124, the motion sensor die 126, and the passive electrical components 128 can be defined in segment 115d opposite the mounting regions 130' and 132' for the IPD die 130 and the ASIC die 132 (FIG. 2A). The signal processing die 136 can be mounted on the mounting region 136' in segment 115e, which can be defined opposite the mounting region 134' that supports the controller die 134 (FIG. 2A).

Figure 3A:
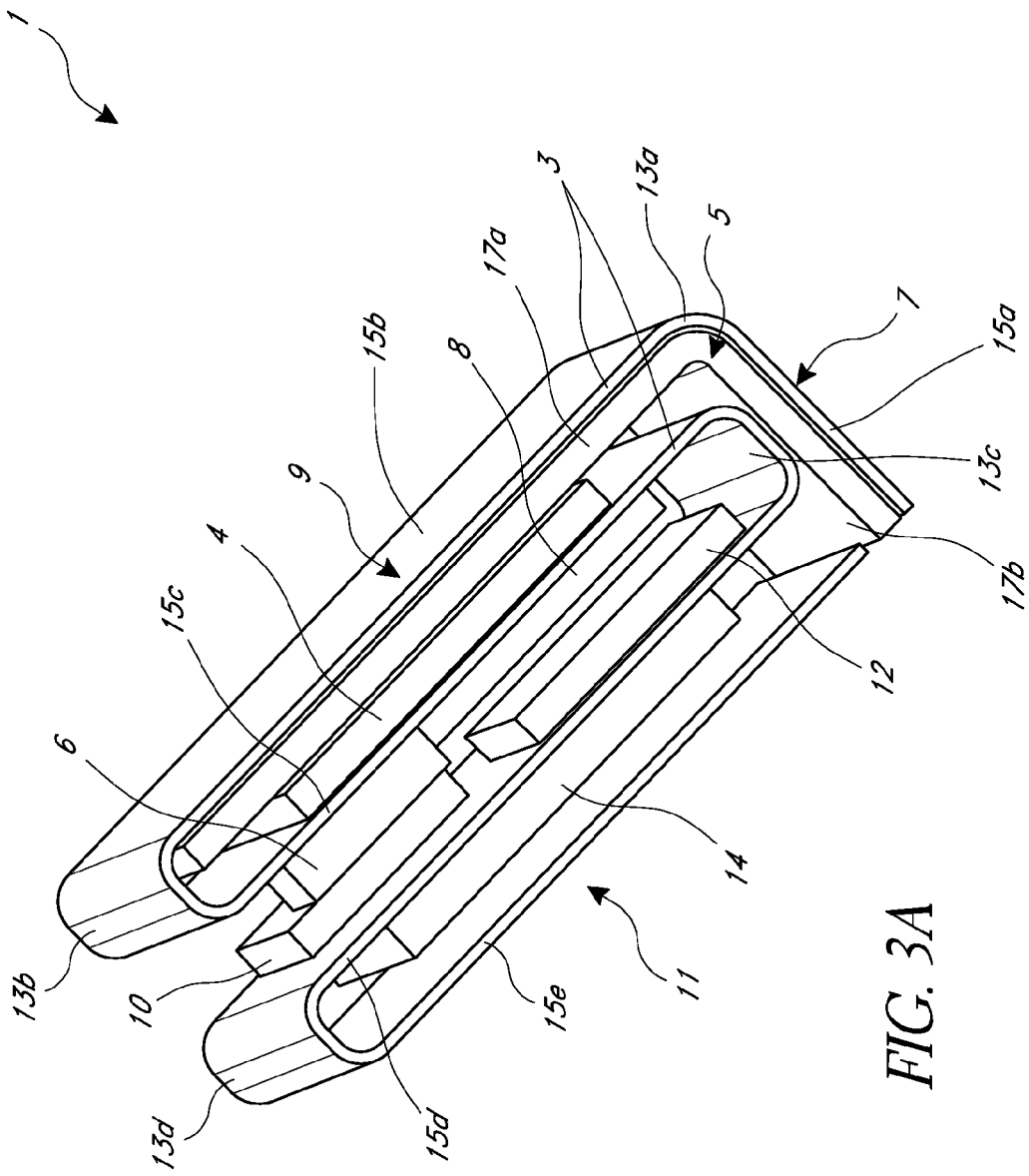
FIG. 3A is a three-dimensional perspective view of an assembled compact device package illustrating a flexible substrate coupled to a two-walled carrier, according to another embodiment.
Figure 3B:
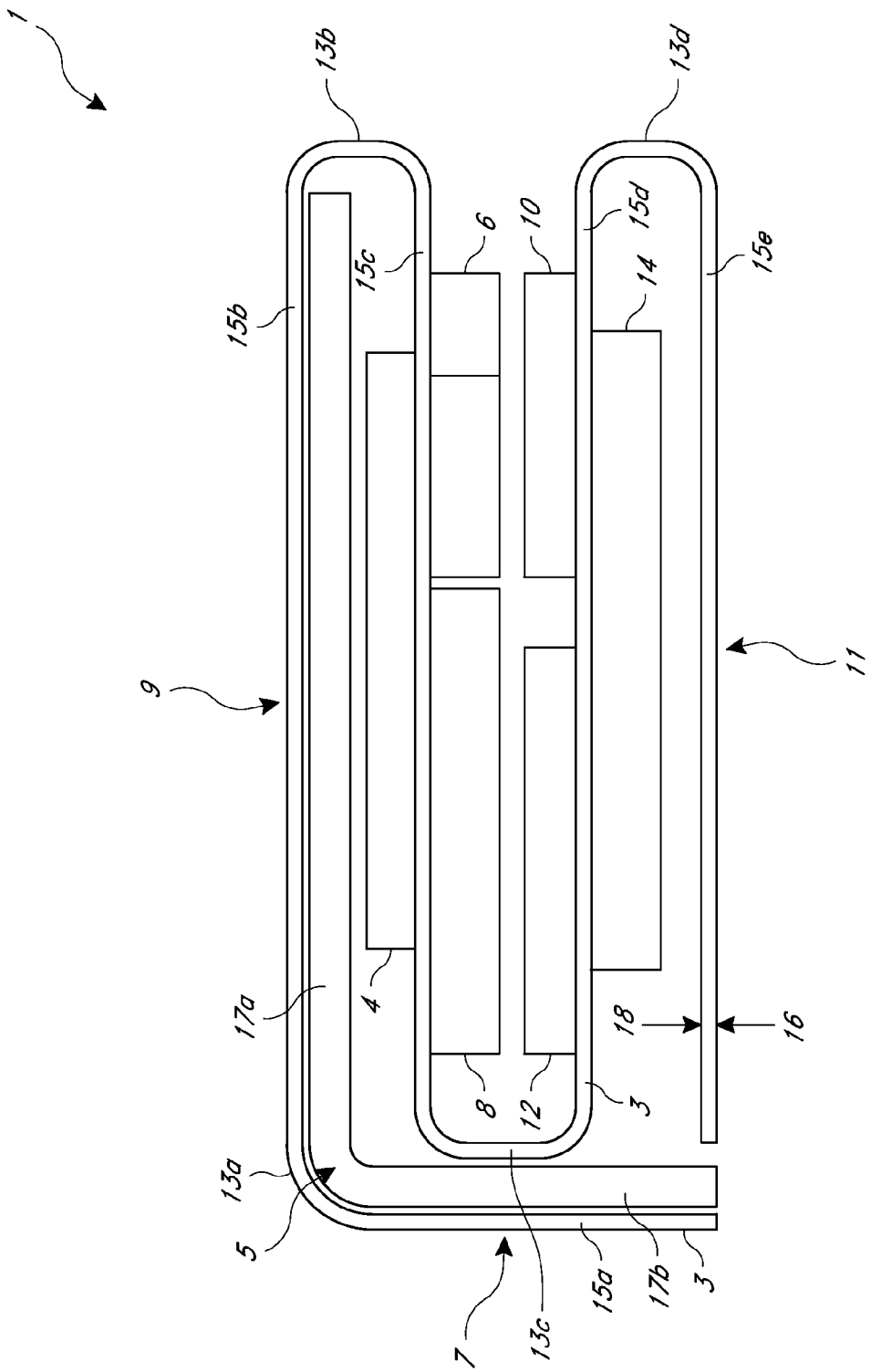
FIG. 3B is a side view of the assembled compact device package of FIG. 3A.

FIG. 3A is a three-dimensional perspective view of an assembled compact device package 1 illustrating a flexible substrate 3 coupled to a carrier 5, according to another embodiment. FIG. 3B is a side view of the assembled compact device package of FIG. 3A. As with the package 100 of FIGS. 1A-1J, the package 1 of FIGS. 3A-3B can be implemented in an electronic device, such as a hearing aid. The package 1 can include components and functionalities that are the same as or similar to the components described herein with respect to the package 100 of FIG. 1A-1J. Unlike the embodiment of FIGS. 1A-1J, however, the embodiment shown in FIGS. 3A-3B includes a carrier 5 having only two walls 17a and 17b angled relative to one another, e.g., at about a 90° angle to provide structure and support for the package 1. Since the package 1 of FIGS. 3A-3B include only two walls, the package 1 may be implemented in a more compact arrangement than the package 100 of FIGS. 1A-1J.

The package 1 of FIG. 3A-3B can include multiple device dies coupled to the substrate 3, in addition to various interfacing features integrated with portions of the substrate 3 that define exterior surfaces of the package 1. For example, the package can include a wireless communications die 4, a capacitive sensor processor die 8, a motion sensor die 6, an IPD die 12, a controller die 10, and a signal processing die 14 coupled to the substrate 3 within the housing, e.g., within the region formed by the two walls 17a and 17b of the carrier 5. The substrate 3 can be similar to the substrate 103 described with respect to FIGS. 1A-1J, and can be, e.g., a flexible substrate capable of being bent or folded in various geometric configurations and including numerous internal conductive traces, bond pads, etc. The entire substrate 3 can be flexible or flexibility can be confined to regions of bends 13a-13d.

Segment 15a can be coupled to wall 17b of the carrier 5, and segment 15b can be coupled to wall 17a of the carrier 5. As illustrated, segments 15a and 15b can define at least part of an exterior surface of the package 1, and bend 13a can be formed between segments 15a and 15b. For example, as shown in FIGS. 3A-3B, the bend 13a can be formed at an angle of between about 80° and about 100°, e.g., about 90°. As with FIGS. 1A-1J, interfacing features can be integrated with the exterior segments 15a and 15b and can communicate from exterior surfaces of the package 1. For example, a capacitive touch sensor 7 can be formed in segment 15a, and a microstrip antenna 9 can be formed in segment 15b, or vice versa. In addition, electrical contacts 11 can be defined on segment 15e and can be configured to provide electrical communication between the package 1 and an external device, such as a system motherboard of a larger electronic device (e.g., a hearing aid).

As described above, bend 13a can be formed along the outer surface of the carrier 5. Within the housing formed by the two walls 17a and 17b, the substrate 3 can include multiple bends. For example, bend 13b can be defined between segments 15b and 15c. Bend 13c can be formed between segments 15c and 15d of the substrate 3. Bend 13d can be defined between segments 15d and 15e. The illustrated bends 13b-13d can be formed at an angle between about 170° and 190°, e.g., at about 180°. As shown, bend 13c can be bent in a direction opposite the direction in which bends 13d and 13e are formed.

In FIGS. 3A-3B, the wireless communications die 4, the capacitive sensor processor die 8, and the motion sensor die 6 can be mounted to the substrate 3 between bend 13b and bend 13c, on the same segment 15c. For example, the wireless communications die 4 can be mounted to a second side 18 of the substrate 3, and the capacitive sensor processor die 8 and the motion sensor die 6 can be mounted to a first side 16 of the substrate 3, e.g., opposite the dies mounted to the second side 18 of the substrate 3. Further, the controller die 10, the IPD die 12, and the signal processing die 14 can be mounted to the substrate 3 between bend 13c and bend 13d on the same segment 15d. As illustrated in FIGS. 3A-3B, for example, the controller die 10 and the IPD die 12 can be mounted on the first side 16 of the substrate 3, and the signal processing die 14 can be mounted on the second side 18 of the substrate 3. As with FIGS. 1A-1J, the illustrated positions of the device dies is for illustrative purposes only; the device dies can instead be positioned in any other suitable positions, in part because the substrate 3 provides electrical communication between all the dies mounted to the substrate 3. The illustrated arrangement may be advantageous in locating signal processing chips close to the corresponding sensors to minimize signal attenuation.

As with the embodiment of FIGS. 1A-1J, the wireless communications die 4 can process data signals received by or transmitted from the antenna 9. The capacitive sensor processor die 8 can analyze and process signals detected by the capacitive touch sensor 7, and the motion sensor die 6 can detect an orientation, speed, and/or acceleration of the package 1. As with the above implementation, the motion sensor die 6 can determine whether the user is falling down and/or whether the user intends to turn the power of the electronic device (e.g., hearing aid) on or off. The IPD die 12 can integrate the management of passive electrical components in the package, and the controller die 10 can manage the overall operation of the package 1, including managing communications between the device dies and managing power consumption of the various components. The signal processing die 14 can process signals detected by the other devices within the package 1 and/or other devices within the larger electronic device (e.g., a separate microphone device package within a hearing aid). Furthermore, an adhesive or molding material can be applied between the wall 17a and segment 15c, between segment 15c and segment 15d, and between segment 15d and segment 15e, in order to provide structural support for the package 1.

Figure 4A:
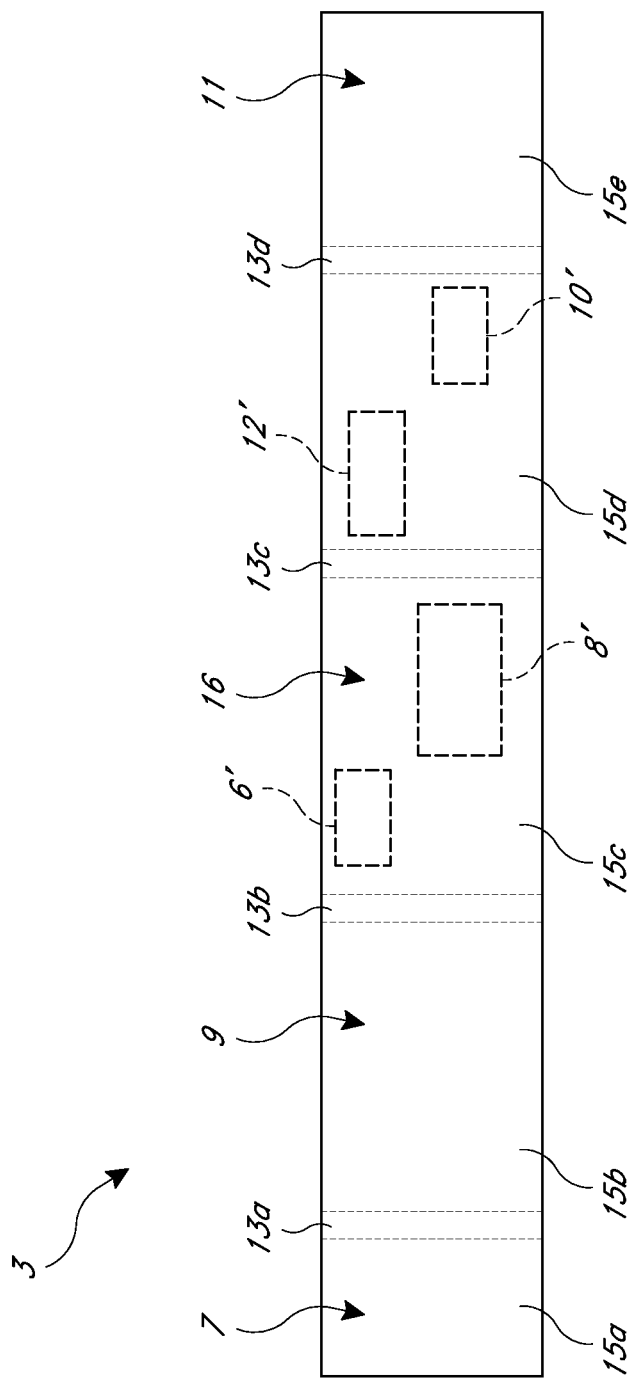
FIG. 4A is a plan view of a first side of the flexible substrate of FIGS. 3A-3B, shown in an unfolded configuration.
Figure 4B:
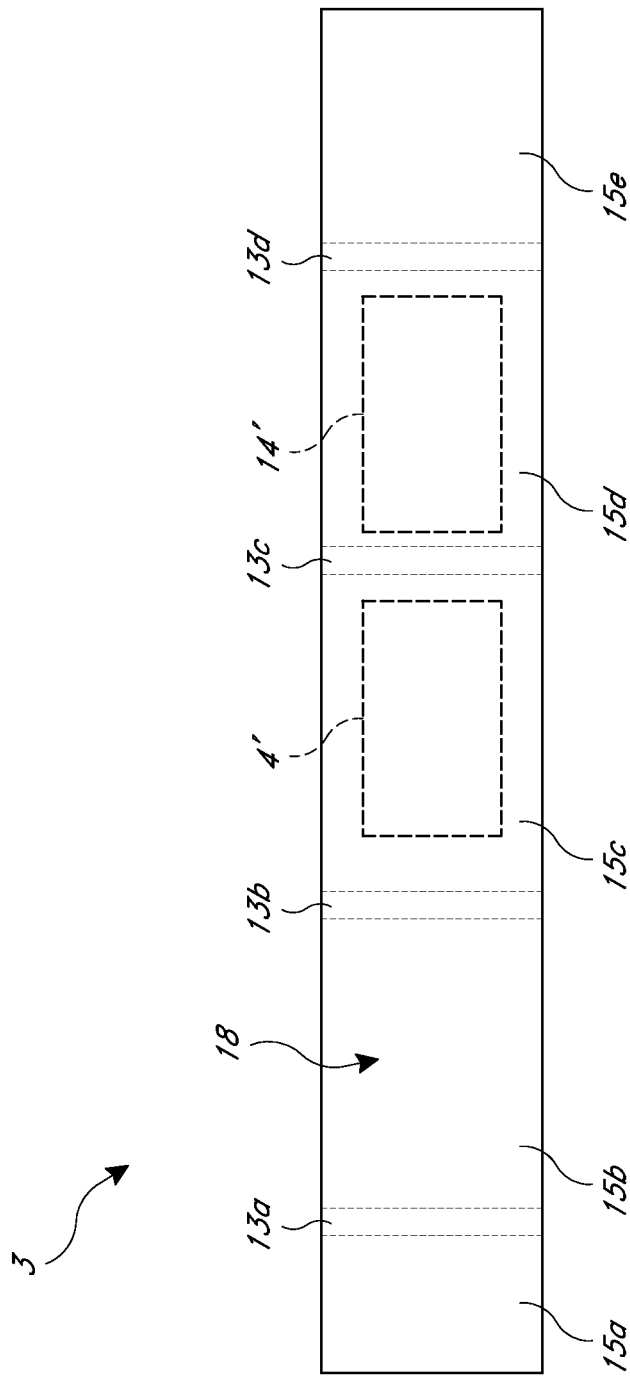
FIG. 4B is a plan view of a second side of the flexible substrate of FIG. 4A, shown in an unfolded configuration.

FIG. 4A is a plan view of the first side 16 of the flexible substrate 3 of FIGS. 3A-3B, shown in an unfolded configuration. FIG. 4B is a plan view of the second side 18 of the flexible substrate 3 of FIG. 4A, shown in an unfolded configuration. The bends 13a-13d are shown in dashed lines, and various mounting regions are also shown in dashed lines and are annotated by the prime symbol ('). Various interfacing features can be formed on the first side 16 of the package 1. For example, the capacitive touch sensor 7 can be formed in or on segment 15a of the substrate 3 and sensitive to touch on the first side 16, and the antenna 9 can be formed in or on segment 15b of the substrate 3 and communicate wirelessly outwardly from the first side 16. The motion sensor die 6 and the capacitive sensor processor die 8 can be mounted to the first side 16 of segment 15c of the substrate 3 in the mounting regions 6' and 8', respectively. Further, the controller die 10 and the IPD die 12 can be mounted to the first side 16 of the segment 15d in mounting regions 10' and 12', respectively. An array of electrical contact pads 11 can also be formed in the first side 16 of segment 15e of the substrate 3.

Furthermore, the wireless communications die 4 can be mounted on the second side 18 of segment 15c of the substrate 3 in mounting region 4', e.g., on the opposite side of the substrate 3 from the motion sensor die 6 and the capacitive sensor processor die 8. The signal processing die 14 can be mounted to the second side 18 of segment 15d of the substrate 3 in mounting region 14', e.g., on the opposite side of the substrate 3 from the controller die 10 and the IPD die 12. As with FIGS. 1A-1J, although the disclosed device dies are shown in particular positions, it should be appreciated that the device dies can instead be mounted on any suitable segment or side of the substrate. Because internal conductive traces provide electrical communication between the dies of the package 1, the device dies can be mounted on any appropriate segment or side of the substrate 3. The illustrated arrangement may be advantageous in locating signal processing chips close to the corresponding sensors to minimize signal attenuation.

Figure 5:
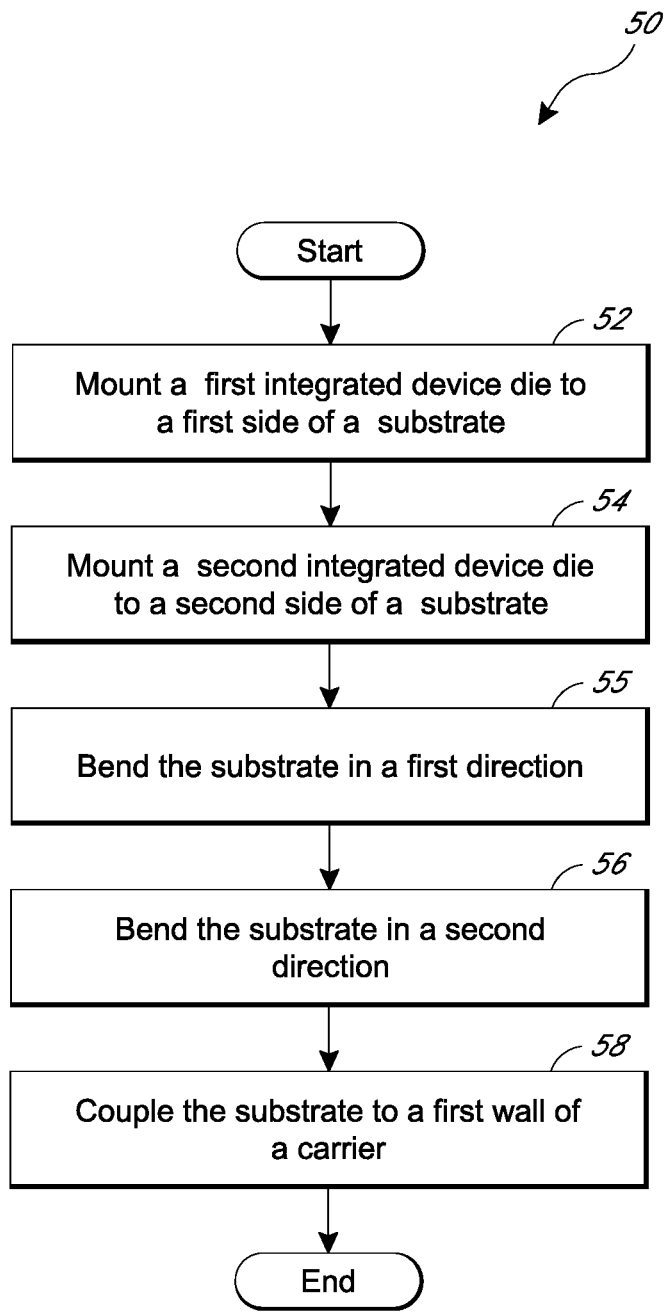
FIG. 5 is a flowchart illustrating a method for manufacturing a compact integrated device package, according to one embodiment.

FIG. 5 is a flowchart illustrating a method 50 for manufacturing a compact integrated device package, according to one embodiment. The method begins in a block 52 to mount a first integrated device die to a first side of a substrate. As explained herein, the first integrated device die can be any suitable die, such as a sensor die or a processor die. The first integrated device die can be electrically coupled to the substrate by way of solder, ACF, or NCP technologies. As explained herein, the substrate can be a flexible substrate that includes multiple conductive traces integrated therein. The substrate can be bent or folded to conform to a desired geometry, and the internal traces can provide electrical communication between the dies mounted to the substrate. Turning to a block 54, a second integrated device die can be mounted to a second side of the substrate, which can be opposite the first side of the substrate. As with the first integrated device die, the second integrated device die can be any suitable die, such as a sensor die or a processor die. In some arrangements, for example, the first integrated device die can be a sensor die, and the second integrated device die can be a processor die associated with the sensor die, or vice versa.

The method 50 then moves to a block 55, in which the substrate is bent in a first direction. As explained herein, the substrate can be bent by any suitable angle, such as, e.g., between about 170° and about 190°. Turning to a block 56, the substrate can be bent in a second direction. In some arrangements, for example, the second bend can be formed in a direction opposite the direction of the first bend. The second bend can also be bent by any suitable angle. In one embodiment, the second bend is bent at about the same angle as the first bend, but in an opposite direction. Further, the first and second bends can be formed such that the first and second integrated device dies are mounted between the first and second bends.

In a block 58, the substrate can be coupled to a first wall of a carrier. The carrier can have at least two walls angled relative to one another and can be configured to provide structural support for the package. In some arrangements, the carrier can be formed of a metal, such as aluminum, or a suitable plastic material. In some embodiments, the substrate can be adhered to a wall of the carrier. As disclosed herein, various segments of the substrate can define exterior surfaces of the compact device package. Interfacing features can be formed in the substrate segments that define the exterior surfaces. For example, a first segment of the substrate can be coupled to a first wall of the carrier, and can define at least part of an exterior surface of the integrated device package. A first interfacing feature can be formed in the first segment. Further, a second segment can be coupled to a second wall of the carrier. The second segment can also define at least part of an exterior surface of the integrated device package, and a second interfacing feature can be formed in the second segment. One example of an interfacing feature is a capacitive touch sensor. In other arrangements, a mechanical interfacing feature, such as a mechanical on/off button, can be formed on the exterior surfaces of the package. As disclosed herein, another example of an interfacing feature is a microstrip antenna. Still other examples of interfacing features may be suitable in various applications.

In some embodiments, a first segment can be disposed adjacent the first bend, a second segment can be disposed between the first bend and the second bend, and a third segment can be disposed adjacent the third bend. The first and second integrated device dies can be mounted to the second segment. To provide structural support between the segments and to support the weight of the device dies, an adhesive or a molding material can be applied between the first segment and the second segment and between the second segment and the third segment. The adhesive or molding material may be cured and hardened to support the segments of the substrate and the device dies. The adhesive or molding material may also serve to encapsulate and/or seal the dies. For example, the adhesive or molding material may protect the dies from moisture and contaminants.

APPLICATIONS

Devices employing the above described schemes can be implemented into various electronic devices. Examples of the electronic devices can include, but are not limited to, consumer electronic products, parts of the consumer electronic products, electronic test equipment, medical devices, etc. Examples of electronic products can include, but are not limited to, a mobile phone, a hearing aid, a wearable electronic device (such as a watch or bandage) that includes one or more biological monitoring sensors, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a washer, a dryer, a washer/dryer, a copier, a facsimile machine, a scanner, a multi functional peripheral device, a wrist watch, a clock, etc. Further, the electronic device can include unfinished products.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. An integrated device package comprising:
   a carrier having at least two walls angled relative to one another;
   a substrate coupled to the carrier, the substrate having a first bend and a second bend;
   a first integrated device die mounted to a first side of the substrate between the first bend and the second bend; and
   a second integrated device die mounted to a second side of the substrate between the first bend and the second bend, the second side opposite the first side.

2. The integrated device package of claim 1, wherein the carrier comprises two substantially perpendicular walls.

3. The integrated device package of claim 1, wherein the carrier comprises three walls that are substantially perpendicular to each other.

4. The integrated device package of claim 1, wherein the first bend and the second bend are bent in opposite directions.

5. The integrated device package of claim 4, wherein each of the first and second bends in the substrate is at an angle in a range of about 170° to about 190°.

6. The integrated device package of claim 1, wherein the first integrated device die is one of a sensor die and a processor die, and wherein the second integrated device die is the other of the sensor die and the processor die.

7. The integrated device package of claim 6, wherein the sensor die is a motion sensor die, and wherein the processor die is an Application-Specific Integrated Circuit die.

8. The integrated device package of claim 1, wherein the substrate includes a first segment adjacent the first bend, a second segment between the first bend and the second bend, and a third segment adjacent the second bend, wherein the first and second integrated device dies are mounted on the second segment of the substrate.

9. The integrated device package of claim 8, wherein the substrate comprises:
   a fourth segment extending from the first segment and folded over a first wall of the carrier, the fourth segment coupled to the first wall; and
   a first interfacing feature formed on an exterior surface of the fourth segment.

10. The integrated device package of claim 9, wherein the first interfacing feature is a capacitive sensor.

11. The integrated device package of claim 9, wherein the first interfacing feature is a microstrip antenna.

12. The integrated device package of claim 9, further comprising a third integrated device die mounted to the first segment of the substrate and configured to process signals received from the first interfacing feature.

13. The integrated device package of claim 9, wherein the substrate further comprises:
   a fifth segment extending from the first segment and folded over a second wall of the carrier, the fifth segment coupled to the second wall; and
   a second interfacing feature formed on an exterior surface of the fifth segment.

14. The integrated device package of claim 13, wherein the first interfacing feature is a capacitive sensor and the second interfacing feature is a microstrip antenna, the package further comprising a fourth integrated device die configured to process signals received by or transmitted from the microstrip antenna.

15. The integrated device package of claim 8, further comprising:
   a fifth integrated device die mounted to the third segment of the substrate; and
   a sixth integrated device die mounted to the third segment of the substrate.

16. The integrated device package of claim 15, wherein the substrate comprises:
   a sixth segment extending from the third segment of the substrate, the sixth segment bent relative to the third segment of the substrate; and
   a plurality of contact pads formed on an exterior surface of the sixth segment, the contact pads configured to electrically couple to an external motherboard.

17. The integrated device package of claim 16, wherein the fifth integrated device die is one of a signal processing die and a controller die, and wherein the sixth integrated device die is the other of the signal processing die and the controller die.

18. An integrated device package comprising:
   a carrier having at least two walls angled relative to one another;
   a substrate having at least one bend and coupled to the carrier, the substrate including a first segment that defines at least part of an exterior surface of the integrated device package;
   a first integrated device die mounted to the substrate; and
   a first interfacing feature formed on the first segment of the substrate.

19. The integrated device package of claim 18, wherein the first interfacing feature is a sensor or a wireless communications component.

20. The integrated device package of claim 19, wherein the first interfacing feature is a capacitive sensor.

21. The integrated device package of claim 19, wherein the first interfacing feature is a microstrip antenna.

22. An integrated device package comprising:
   a carrier;
   a substrate having at least one bend and coupled to the carrier, the substrate including a first segment that defines at least part of an exterior surface of the integrated device package;
   a first integrated device die mounted to the substrate; and
   a first interfacing feature formed on the first segment of the substrate,
   wherein the first interfacing feature is a sensor or a wireless communications component,
   wherein the substrate further comprises a plurality of contact pads configured to electrically couple to an external motherboard.

23. The integrated device package of claim 19, wherein the first interfacing feature is an optical sensor, a microelectromechanical systems (MEMS) sensor, a pressure sensor, or a temperature sensor attached to or integrated with the first segment of the substrate.

24. An integrated device package comprising:
   a carrier;
   a substrate having at least one bend and coupled to the carrier, the substrate including a first segment that defines at least part of an exterior surface of the integrated device package;
   a first integrated device die mounted to the substrate; and
   a first interfacing feature formed on the first segment of the substrate,
   wherein the first interfacing feature is a sensor or a wireless communications component,
   wherein the substrate comprises a second segment that defines at least part of the exterior surface of the integrated device package, the integrated device package further comprising a second interfacing feature formed on the second segment of the substrate.

25. The integrated device package of claim 24, wherein the first interfacing feature is a capacitive sensor, and wherein the second interfacing feature is a microstrip antenna.

26. The integrated device package of claim 25, further comprising a first processor die coupled to the substrate and configured to process data detected by the capacitive sensor, and a second processor die coupled to the substrate and configured to process signals received by or transmitted from the microstrip antenna.

27. The integrated device package of claim 24, wherein the substrate comprises a third segment that defines at least part of the exterior surface of the integrated device package, the integrated device package further comprising a plurality of contact pads formed in the third segment and configured to electrically couple to an external motherboard.

28. An integrated device package comprising:
- a carrier having at least two walls angled relative to one another, the at least two walls defining a package housing;
- a substrate coupled to the carrier, the substrate having at least one bend within the housing, the bend separating first and second segments;
- a first integrated device die mounted to a first side of the first segment of the substrate; and
- a second integrated device die mounted to a second side of the first segment of the substrate, the first side opposite the second side.

29. The integrated device package of claim 28, wherein a third segment of the substrate is coupled to an exterior surface of the package housing, the package further comprising a first interfacing feature formed on the third segment of the substrate.

30. The integrated device package of claim 29, wherein the first interfacing feature comprises a capacitive sensor.

31. The integrated device package of claim 29, wherein the first interfacing feature comprises a microstrip antenna.

32. A method for manufacturing an integrated device package, the method comprising:
- providing a carrier having at least two walls angled relative to one another;
- mounting a first integrated device die to a first side of a substrate;
- mounting a second integrated device die to a second side of the substrate, the second side opposite the first side;
- bending the substrate in a first direction to form a first bend;
- bending the substrate in a second direction to form a second bend, the second direction opposite the first direction; and
- coupling a segment of the substrate to a first wall of the carrier,
- wherein the first integrated device die and the second integrated device die are mounted between the first bend and the second bend.

33. The method of claim 32, wherein coupling the segment of the substrate to the first wall of the carrier comprises defining at least part of an exterior surface of the integrated device package with the segment, the method further comprising forming a first interfacing feature in the segment.

34. The method of claim 33, further comprising coupling another segment to a second wall of the carrier to define at least part of an exterior surface of the integrated device package with the other segment, and forming a second interfacing feature in the other segment.

35. The method of claim 32, wherein a first segment is disposed adjacent the first bend, wherein a second segment is disposed between the first bend and the second bend, and wherein a third segment is disposed adjacent the third bend, the first and second integrated device dies mounted to the second segment, the segment coupled to the first wall comprising a fourth segment adjacent the first segment, the method further comprising applying an adhesive or a molding material between the first segment and the second segment and between the second segment and the third segment.

36. The integrated device package of claim 18, wherein the first interfacing feature is integrally formed in the substrate.

* * * * *